United States Patent [19]
Ohtani et al.

[11] Patent Number: 6,130,852
[45] Date of Patent: Oct. 10, 2000

[54] MEMORY INTEGRATED CIRCUIT DEVICE INCLUDING A MEMORY HAVING A CONFIGURATION SUITABLE FOR MIXTURE WITH LOGIC

[75] Inventors: Jun Ohtani; Akira Yamazaki; Naoto Okumura; Takashi Higuchi, all of Hyogo, Japan

[73] Assignee: Mitsubishi Denki Kabushiki Kaisha, Tokyo, Japan

[21] Appl. No.: 09/226,158

[22] Filed: Jan. 7, 1999

Related U.S. Application Data

[63] Continuation of application No. PCT/JP96/03154, Oct. 28, 1996.

[51] Int. Cl.[7] ........................................ G11C 8/00
[52] U.S. Cl. .................... 365/230.03; 365/189.08; 365/220; 365/189.12
[58] Field of Search ................ 365/230.03, 220, 365/189.08, 189.12, 230.01, 189.01

[56] References Cited

U.S. PATENT DOCUMENTS

| | | | |
|---|---|---|---|
| 5,592,434 | 1/1997 | Iwamoto et al. | 365/233 |
| 5,603,009 | 2/1997 | Konishi et al. | 395/492 |

FOREIGN PATENT DOCUMENTS

| | | |
|---|---|---|
| 2-246090 | 10/1990 | Japan . |
| 4-252486 | 9/1992 | Japan . |
| 5-234364 | 9/1993 | Japan . |
| 6-195261 | 7/1994 | Japan . |
| 6-318391 | 11/1994 | Japan . |
| 7-130166 | 5/1995 | Japan . |
| 8-181292 | 7/1996 | Japan . |

OTHER PUBLICATIONS

"Advances in DRAM Interfaces", by Kumanoya et al., IEEE Micro, vol. 15, No. 6, Dec. 1, 1995, pp. 30–36.

"Fast DRAMs Can Be Swapped for SRAM Caches", by Bursky, Electronic Design, vol. 41, No. 15, Jul. 22, 1993, pp. 55–56, 60, 62, 64, 66, and 70.

"A Multimedia 32B RISC Microprocessor with 16Mb DRAM", by Shimizu et al., IEEE International Solid State Circuits Conference, vol. 39, Feb. 1, 1996, pp. 216–217, 448.

"A 180MHz Multiple–Registered DRAM for Low–Cost 2MB/Chip Secondary Cache", by Iwamoto et al., Proceedings of the Custom Integrated Circuits Conference, May 1, 1998, pp. 591–594.

"A 90–MHz 16–Mb System Integrated Memory with Direct Interface to CPU", by Dosaka et al., IEEE Journal of Solid–State Circuits, vol. 31, No. 4, Apr. 1, 1996, pp. 537–544.

*Primary Examiner*—David Nelms
*Assistant Examiner*—Hoai V. Ho
*Attorney, Agent, or Firm*—McDermott, Will & Emery

[57] ABSTRACT

Registers are arranged along at least opposite two sides of the four sides of a dynamic random access memory cell array. The registers are interconnected via an internal data bus line used for internal data transfer for the memory cell array. At least one register of the registers arranged along the opposite two sides is coupled with an external data bus, and the other register is coupled with an internal circuit via an internal data bus. An external controller which controls an operation in response to an external control signal is provided for the register coupled with an external circuit. An internal controller which controls an operation according to a control signal from the internal circuit is provided for the register coupled with the internal circuit. The external and internal circuits are permitted to simultaneously access the memory cell array only when the external and internal circuits read the data of a memory cell located at the same address of the memory cell array.

20 Claims, 17 Drawing Sheets

|  | CB #0 | CB #1 | CB #2 | CB #3 | CB #4 | CB #5 | CB #6 | CB #7 |
|---|---|---|---|---|---|---|---|---|
| RB#0 | SBA 00 | SBA 01 | SBA 02 | SBA 03 | SBA 04 | SBA 05 | SBA 06 | SBA 07 |
| RB#1 | SBA 10 | SBA 11 | SBA 12 | SBA 13 | SBA 14 | SBA 15 | SBA 16 | SBA 17 |
| RB#2 | SBA 20 | SBA 21 | SBA 22 | SBA 23 | SBA 24 | SBA 25 | SBA 26 | SBA 27 |
| RB#3 | SBA 30 | SBA 31 | SBA 32 | SBA 33 | SBA 34 | SBA 35 | SBA 36 | SBA 37 |
| RB#4 | SBA 40 | SBA 41 | SBA 42 | SBA 43 | SBA 44 | SBA 45 | SBA 46 | SBA 47 |
| RB#5 | SBA 50 | SBA 51 | SBA 52 | SBA 53 | SBA 54 | SBA 55 | SBA 56 | SBA 57 |
| RB#6 | SBA 60 | SBA 61 | SBA 62 | SBA 63 | SBA 64 | SBA 65 | SBA 66 | SBA 67 |
| RB#7 | SBA 70 | SBA 71 | SBA 72 | SBA 73 | SBA 74 | SBA 75 | SBA 76 | SBA 77 |

MEMORY INTEGRATED CIRCUIT DEVICE INCLUDING A MEMORY HAVING A CONFIGURATION SUITABLE FOR MIXTURE WITH LOGIC

REFERENCE TO RELATED APPLICATION

This Application is a continuation of International Application No. PCT/JP96/03154, whose international filing date is Oct. 28, 1996, the disclosures of which Applications are incorporated by reference herein. The benefit of the filing and priority dates of the International Application is respectfully requested.

BACKGROUND OF THE INVENTION

1. Field of the Invention

The present invention relates to memory integrated circuit devices, and in particular to a memory integrated circuit device having a dynamic random access memory (DRAM) and a plurality of registers for data transfer formed on the same chip. More specifically, the present invention relates to a logic integrated DRAM in which a DRAM, a logic such as a processor, and registers for data transfer between the DRAM and the logic and between the DRAM and the external are formed on the same chip.

2. Description of the Background Art

Logics such as processors have been improved in performance and enhanced in operating speed. The DRAM employed as a main storage in a memory system has also been increased in storage capacity and operating speed. In a DRAM, a memory cell includes a capacitor for storing information in the form of electric charges, and an access transistor configured of an insulated gate type field effect transistor (MOS transistor) for selecting the capacitor. In order to avoid threshold voltage loss of the stored information caused by the access transistor in writing and reading information into and from the capacitor, the gate potential of the access transistor (i.e. a word line potential) is boosted to a voltage level higher than a normal operating power supply voltage. Thus, microfablication of the elements configuring a DRAM is behind that of the elements configuring a logic large-scale integrated device (LSI) such as a processor and the operating speed of the DRAM cannot keep up with that of the logic LSI. Consequently the performance of the memory systems in which the DRAM is employed as the main storage is limited by the operating speed of the DRAM. Moreover, in the data transfer between the DRAM and the logic LSI, the number of bits of the data transferred at one time depends on the number of the data input/output pin terminals of the DRAM, and transfer of a large amount of data at high speed cannot be achieved. During this transfer period, the logic LSI such as a processor is kept in a wait state until the required data reaches the logic LSI, and the performance of the system is thus degraded.

In order to eliminate such disadvantages attributed to DRAM, a DRAM and a logic such as a processor may be formed on the same chip. The data bus between the DRAM and the logic is an interconnection line internal to the chip and the width of the bus (i.e. the number of the bits of the bus) can be increased. Also, the interconnection line internal to the chip is smaller in load than an on-board wire and can rapidly transfer a large amount of data. For such a logic-integrated DRAM or a logic LSI mixed with a DRAM that the DRAM and the logic are formed on the same chip, sufficient consideration need be given to the configuration of the DRAM to allow the efficient data transfer, and to the data transfer between the DRAM and an external circuit or an internal circuit (a logic).

SUMMARY OF THE INVENTION

An object of the present invention is to provide a memory integrated circuit device having a configuration suitable for integration with logic such as processor.

Another object of the present invention is to provide a memory integrated circuit device having a configuration suitable for integration with logic and capable of efficient data transfer.

In a memory integrated circuit device according to the present invention, a plurality of internal data bus lines transmitting and receiving data to and from a memory cell selected in a memory array are coupled with a plurality of registers each having register circuits the number of which is the same as the bus width of the data bus.

Preferably, the plurality of registers are arranged individually along at least two sides of four sides of the memory array. Preferably, the registers are arranged oppositely in the direction in which the internal data bus lines extend.

Apart from the oppositely arranged registers, a registers connected to the internal data bus lines by interconnection lines of another interconnection layer and different from the internal data bus lines are arranged along remaining sides of the memory array.

Each of the plurality of registers is also adapted to function to read/write data under the control of a control circuit.

The interconnection of registers via the internal data bus lines of the memory cell array can eliminate the necessity of arranging additional interconnection lines for data transfer between the registers and thus can reduce the area occupied by interconnection lines.

Moreover, the internal data bus lines in the memory cell array, arranged linearly, can interconnect the registers at the minimum distance and thus allow rapid data transfer.

Since a plurality of registers are interconnected via internal data bus lines, the data from one register can be written into a memory cell selected in the memory array, while a data transfer to another register can be simultaneously achieved. Also, the data read from the memory array can be stored into the plurality of registers simultaneously.

Furthermore, another interconnection layer used to also connect further registers to the internal data bus lines allows rapid data transfer to various internal or external circuitry.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figures 1, 2:
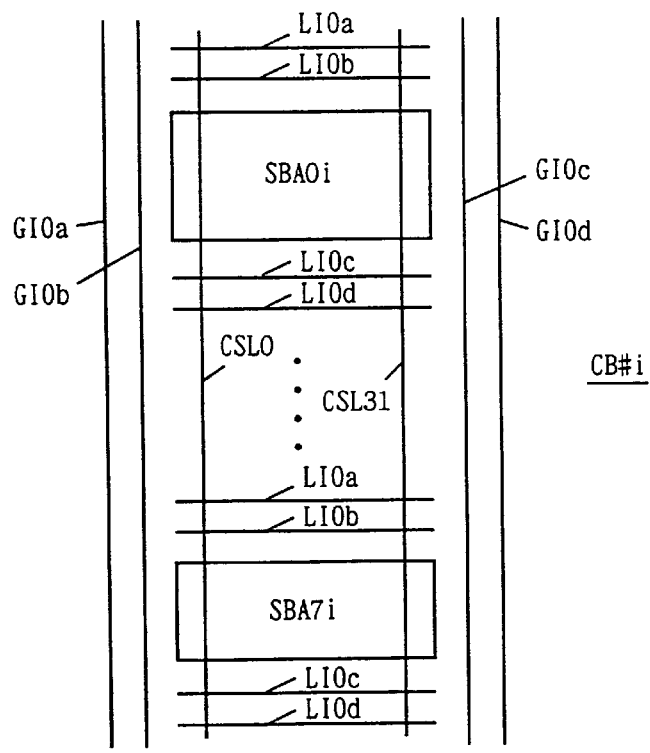
FIG. 1 schematically shows the configuration of a DRAM memory cell array used in a memory integrated circuit device according to the present invention.
FIG. 2 schematically shows a bus arrangement for one column block of the memory cell array shown in FIG. 1.

FIG. 1 schematically shows an exemplary configuration of an array portion of a DRAM used in the present invention. A DRAM array 1 shown in FIG. 1, as will be described later, includes a plurality of dynamic memory cells arranged in a matrix. Memory cell array 1 is divided into a plurality of subarray blocks SBA00 to SBA77 each having a plurality of dynamic memory cells arranged in rows and columns. Subarray blocks SBA00 to SBA77 are arranged in a matrix and grouped into eight row blocks RB#0 to RB#7 and eight column blocks CB#0 to CB#7. Each row block includes eight subarray blocks arranged alignedly in the row direction, and each column block includes eight subarray blocks arranged alignedly in the column direction. In a memory cell select operation in memory cell array 1, one of eight row blocks RB#0 to RB#7 is driven to a selected state.

FIG. 2 shows an arrangement of an internal data bus line for one column block CB#i shown in FIG. 1. In FIG. 2, column block CB#i includes eight subarray blocks SBA0i to SBA7i and is provided with four common global IO lines (pairs) GIOa to GIOd extending in the column direction. Subarray blocks SBA0i to SBA7i are each provided with four local IO lines (pairs) LIOa, LIOb, LIOc and LIOd for transmitting and receiving data to and from only the corresponding subarray block. In one column block CB#i, one of eight subarray blocks SBA0i to SBA7i is put into a selected state and the selected subarray block transmits and receives data to and from global IO lines GIOa to GIOd via local IO lines LIOa to LIOd.

Figure 3:
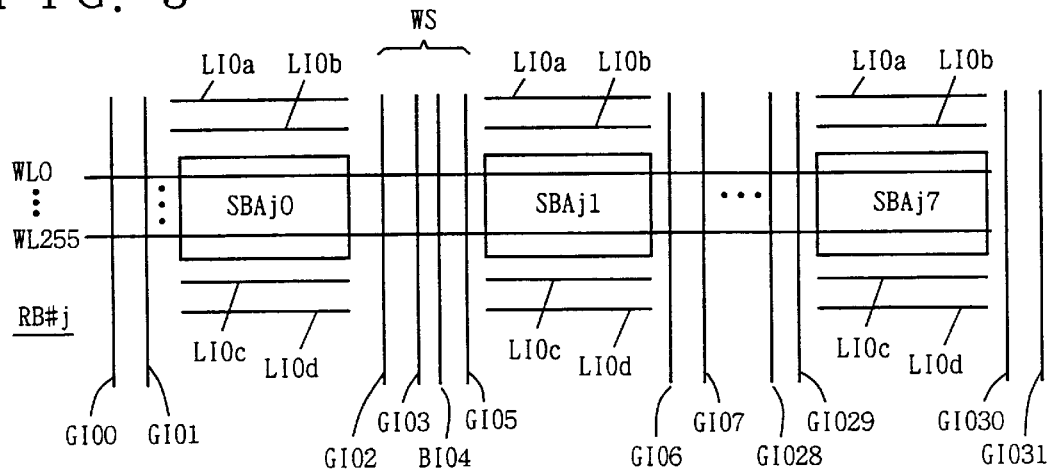
FIG. 3 shows a bus arrangement for one row block of the memory cell array shown in FIG. 1.

FIG. 3 shows a schematic configuration of one row block RB#j among the eight row blocks shown in FIG. 1. In FIG. 3, row block RB#j includes eight subarray blocks SBAj0 to SBAj7 arranged alignedly in the row direction. Subarray blocks SBAj0 to SBAj7 are each provided with four local IO lines LIOa to LIOd. Subarray blocks SBAj0 to SBAj7 are provided with common word lines WL0 to WL255 each connected to the memory cells arranged that alignedly in each respective row of subarray blocks SBAj0 to SBAj7.

Subarray blocks SBAj0 to SBAj7 are each provided with four global IO lines GIOs extending in the column direction. In FIG. 3, subarray block SBAj0 is provided with four global IO lines GIO0 to GIO3, subarray block SBAj1 is provided with global IO lines GIO4 to GIO7, and subarray block SBAj7 is provided with global IO lines GIO28 to GIO31. Thus, a total of 32 global IO lines are arranged to allow simultaneous 32-bit memory cell data transfer. The global IO lines are arranged in the areas between the subarray blocks. These areas are not provided with memory cells and are referred to as a word line shunt region WS in which each of word lines WL0 to WL255 is connected to a low-resistance metal interconnection line (a first level aluminum interconnection line). The word lines in the subarray blocks are formed of the first layer polysilicon interconnection lines. The connection of the relatively highly resistive polysilicon word lines to the low-resistance metal interconnection layer in word line shunt region WS equivalently reduces the resistance of the word lines and allows rapid transmission of word line select signals.

Figure 4:
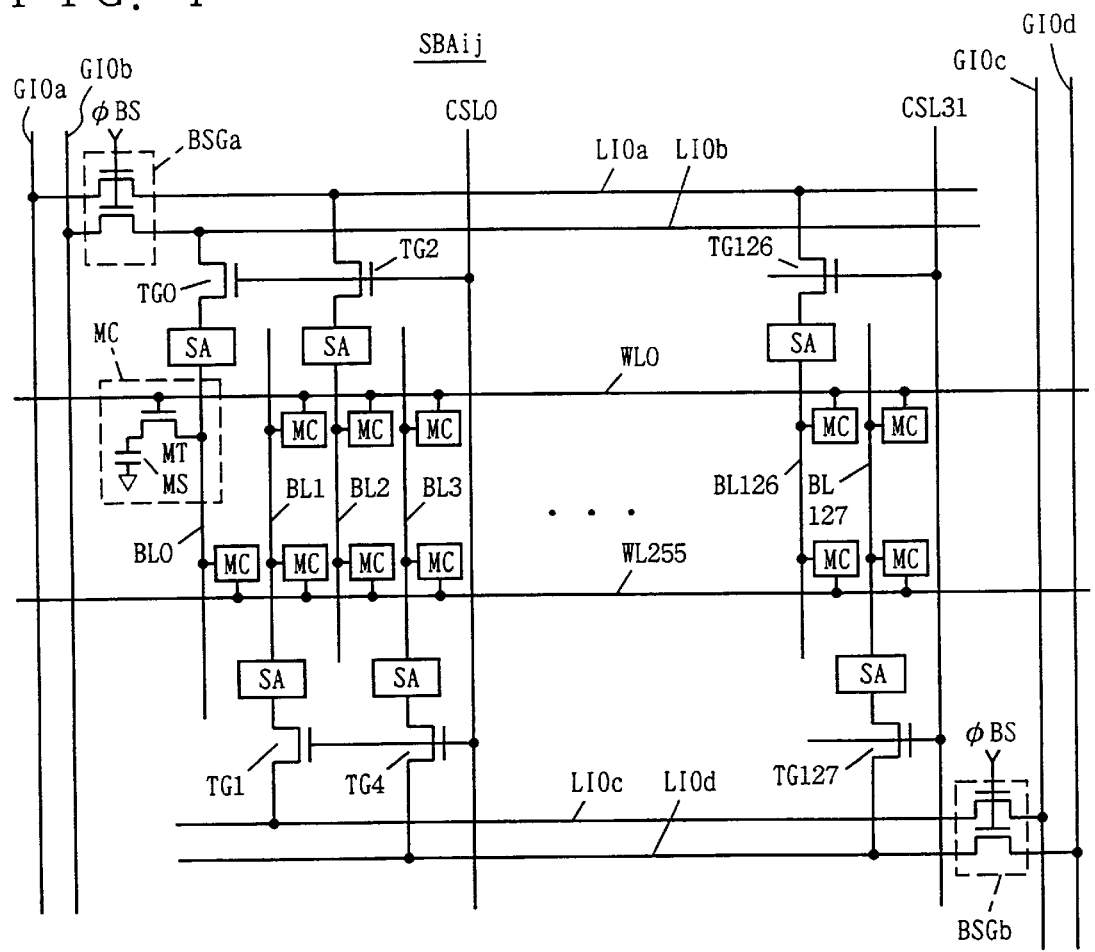
FIG. 4 schematically shows the configuration of one subblock of the memory cell array shown in FIG. 1.

FIG. 4 schematically shows a configuration of one subarray block of the memory array shown in FIG. 1. In FIG.

4, subarray block SBAij is provided with four global IO lines GIOa to GIOd and includes memory cells MCs arranged in 256 rows and 128 columns. Word lines WL0 to WL255 are each connected to memory cells MCs of one row. Bit lines BL0 to BL127 are arranged corresponding to the respective columns of memory cells MCs. Bit lines BL0 to BL127 are each provided with a sense amplifier SA which is activated to sense, amplify and latch the potential on the corresponding bit line. For DRAMs, as is well known, bit lines BL0 to BL127 are each configured of signal lines complementary to each other and sense amplifier SA differentially amplifies the potentials of the complementary signal lines of the corresponding bit line. In FIG. 4, a bit line pair is represented as a bit line in order to simplify the figure. Accordingly, local IO lines LIOa to LIOd and global IO lines GIOa to GIOd are all complementary signal line pairs.

Sense amplifiers SAs are arranged on both sides of bit lines BL0 to BL127 alternately. More specifically, even-numbered bit lines BL0, BL2, . . . , BL126 have their respective sense amplifiers SAs arranged closer to local IO lines LIOa and LIOb, and the odd-numbered bit lines BL1, BL3, . . . , BL127 have their respective sense amplifiers SAs arranged closer to local IO lines LIOc and LIOd. This arrangement of sense amplifiers is known as an "alternate arrangement".

Column select lines CSL0 to CSL31 extending in the column direction of the memory cell array and transmitting a column select signal from a column decoder (not shown) are commonly arranged for the subarray blocks in a column block. Each of column select lines CSL0 to CSL31 selects four bit lines simultaneously when selected. In FIG. 4, column select line CSL0 selects bit lines BL0 to BL3 simultaneously, and column select line CSL31 selects bit lines BLs124 and 125 (not shown) and bit lines BLs126 and 127 simultaneously. Arranged between each sense amplifier and an adjacent local IO line is a column select gate TG turned on in response to a signal on a column select line for connecting the corresponding sense amplifier to the adjacently arranged local IO line. In FIG. 4, bit lines BL0 to BL127 are respectively provided with column select gates TG0 to TG127.

Also provided are a block select gate BSGa turned on in response to a row block select signal φBS from a block decoder (not shown) to respectively connect local IO lines LIOa and LIOb to global IO lines GIOa and GIOb, and a block select gate BSGb turned on in response to block select signal φBS to connect local IO lines LIOc and LIOd to global IO lines GIOc and GIOd to global IO lines GIOc and GIOd. Row block select signal φBS is commonly applied to the subarray blocks included in a row block. One column select line selects four bit lines simultaneously for connection via local IO lines LIOa to LIOd to global IO lines GIOa to GIOd.

Memory cell MC includes a capacitor MS for storing information, and an access transistor MT turned on in response to a signal potential on an associated word line to connect capacitor MS to an associated bit line. Access transistor MT is constituted by an n-channel MOS transistor.

While in FIG. 4, sense amplifiers SA are alternately arranged in one subarray block to show an arrangement of the local IO lines and GIO lines for one subarray, sense amplifiers SAs may be arranged in the "shared sense amplifier configuration", in which sense amplifiers are shared by subarray blocks adjacently arranged in the column direction. In this example, a local IO line is shared by two subarray blocks (i.e. subarray blocks that are adjacently arranged in the column direction). In this "alternate, shared sense amplifier configuration" also, four bit lines are simultaneously selected in a selected subarray and connected to global I/O lines.

Figure 5:
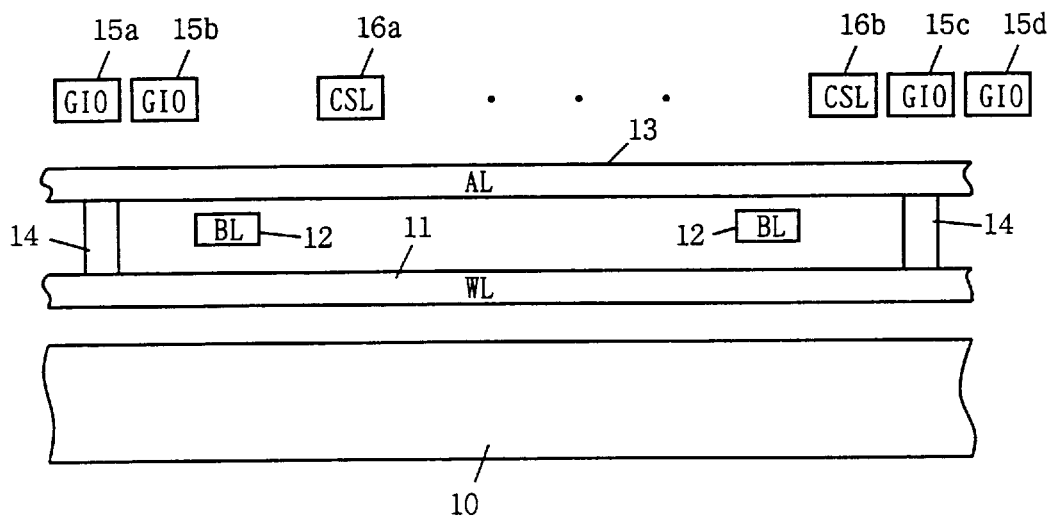
FIG. 5 schematically illustrates a relation between the interconnection layers in a memory cell array.

FIG. 5 schematically shows an interconnection layer for each signal line in one subarray block. In FIG. 5, a word line (WL) 11 formed of the first level polysilicon is provided above a surface of a semiconductor substrate region 10 on which a memory cell is formed. In order to simplify the figure, FIG. 5 does not show the configuration of a memory cell formed on the surface of semiconductor substrate region 10. On word line 11 formed in the first level polysilicon interconnection layer a bit line (BL) 12 formed in the second level polysilicon interconnection layer and extending in the column direction is provided.

On bit line 12, a metal interconnection line (AL) 13 formed in the first level metal (e.g. aluminum) interconnection layer is provided parallel to word line 11. Metal interconnection line 13 is connected in a word line shunt region via a contact 14 to word line 11. Global IO lines 15a, 15b, 15c and 15d, formed in the second level for metal (e.g. aluminum) interconnection layer and extending in the column direction are arranged on metal interconnection line 13 formed in the first level metal (e.g. aluminum) interconnection layer at the regions corresponding to word line shunt regions. Column select lines (CSLs) 16a to 16b formed in the second level metal (e.g. aluminum) interconnection layer also extend in the column direction.

By configuring bit line 12 and column select lines 16a to 16b into a multilayer configuration, column select lines 16a to 16b can be arranged without adversely affecting the pitch of bit line 12. Furthermore, column select lines 16a to 16b provided one for four bit lines 12 can be arranged with a sufficient margin.

Similarly, global IO lines (GIOs) 15a to 15d arranged in word line shunt regions can be arranged without adversely affecting the arrangement of the memory cells in the subarray blocks. Although the local IO lines (LIOa to LIOd) are not shown in FIG. 5, they are formed in the same interconnection layer as metal interconnection line 13, i.e. the first level metal (e.g. aluminum) interconnection layer. The interconnection between column select line 13 and column select gate TG (TG0 to TG17) is also made by the first level metal (e.g. aluminum) interconnection line.

If a capacitor of a memory cell is a stacked type capacitor and in particular a planar stacked type capacitor or T-shaped stacked type capacitor, an electrode of the capacitor (i.e. a cell place capacitor) is formed underlying a bit line and overlying a word line. If a memory cell capacitor is a cylindrical stacked capacitor, the cell plate electrode is formed overlying a bit line.

Although the memory cell array is described as having a memory capacity of 2M bits, the memory capacity of the memory cell array may be greater than 2M bits and may be appropriately determined depending on the application.

Figure 6:
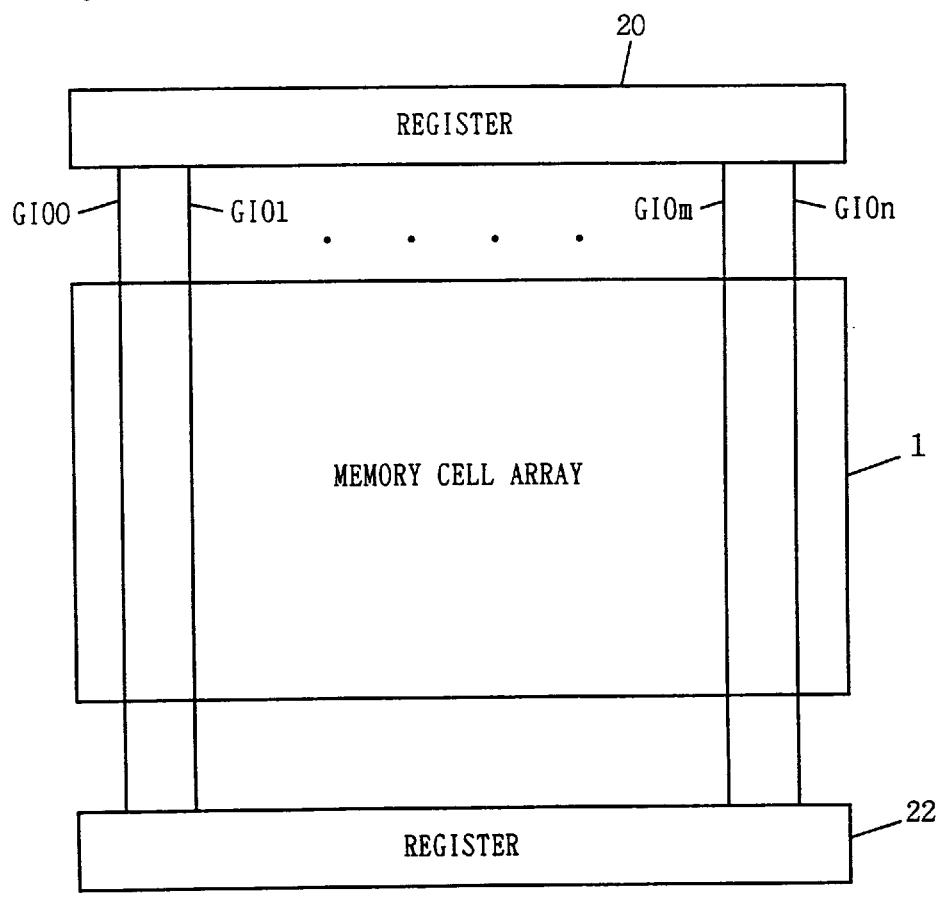
FIG. 6 schematically shows the configuration of a main portion of a memory integrated circuit device according to a first embodiment of the present invention.

FIG. 6 shows a schematic configuration of a memory integrated circuit device according to the first embodiment of the present invention. In FIG. 6, a first register 20 and a second register 22 are arranged along the opposite sides in the column direction of memory cell array 1 the configuration of which is similar to that shown in FIGS. 1 to 5. Registers 20 and 22 are connected to global IO lines GIO0 to GIOn provided in memory cell array 1. When the memory cell array is selected, global IO lines GIO to GIOn transmit or receive to or from selected memory cells in memory cell array 1. Thus, when memory cell array 1 is selected, the connection of registers 20 and 22 to global IO lines GIO0 to GIOn allows data to be communicated between one register and memory cells selected in the memory cell array and also allows the data to be transferred to the other register.

While memory cell array 1 is not selected, the block select signal φBS indicated in FIG. 4 is in an inactive state and global IO lines GIO0 to GIOn are disconnected from local IO bus LIO (LIOa to LIOd) of memory cell array 1. Accordingly, when memory cell array 1 is in an inactive state, global IO lines GIO0 to GIOn can be used to transfer data between registers 20 and 22. Even with memory cell array 1 placed in a selected state and a word line driven to a selected state, global IO lines GIO0 to GIOn do not communicate data with memory cells selected in memory cell array 1 while the column select signal is in an inactive state. Accordingly, global IO lines GIO0 to GIOn can similarly be used to transfer data between registers 20 and 22. (For DRAMs, a row select/drive circuit and a column select/drive circuit are different control circuits.)

Arranging the registers 20 and 22 along opposite sides of memory cell array 1 as shown in FIG. 6 eliminates the necessity of arranging another data bus for the data transfer between registers 20 and 22 and thus reduces the area occupied by interconnection lines. Furthermore, the linear arrangement of global IO lines GIO0 to GIOn along the column direction of memory cell array implements the minimum distance and hence rapid data transfer between registers 20 and 22. Furthermore, connection of registers 20 and 22 to global IO lines GIO0 to GIOn, allows simultaneous data transfer to global IO lines GIO0 to GIOn, and an increased number of global IO lines GIO0 to GIOn allows a collective transfer of a large amount of data and can thus improve data transfer efficiency. (For an array with a memory capacity of 8M bits, the number of global IO lines is 32·4=128.)

Connecting the registers 20 and 22 with global IO lines GIO0 to GIOn also allows registers 20 and 22 to function as an input/output buffer of the DRAM. Accordingly, it is not necessary to input and output data via an input/output buffer of the DRAM and rapid data transfer can thus be achieved. The input/output buffer may be further provided separately. The input/output buffer and the global IO bus are coupled with each other via an IO selector.

Figure 7:
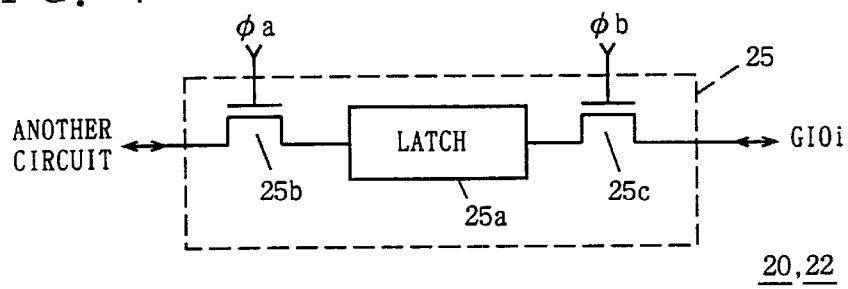
FIG. 7 schematically shows the configuration of a register circuit included in the register shown in FIG. 6.

FIG. 7 schematically shows the configuration of a register circuit included in registers 20 and 22. FIG. 7 representatively shows a register circuit 25 provided for one global IO line GIOi. In FIG. 7, register circuit 25 includes: a latch 25a for latching a received information; a connection gate 25b turned on in response to a transfer instruction signal φa to connect latch 25a to another circuit; and a connection gate 25c responsive to a transfer instruction signal φb for electrically connecting latch 25a to global IO line GIOi. The another circuit mentioned above may be any circuit other than memory array 1 and has only to be an external circuit or an internal circuit (a logic or a processor) provided within the same chip.

Latch 25a functions to transfer data in bi-direction and to store data. More specifically, latch 25a functions to store data supplied thereto and to transfer the stored data to another circuit. Latch 25a also functions to transfer data on global IO line GIOi and to store the data supplied on global IO line GIOi.

Figure 8:
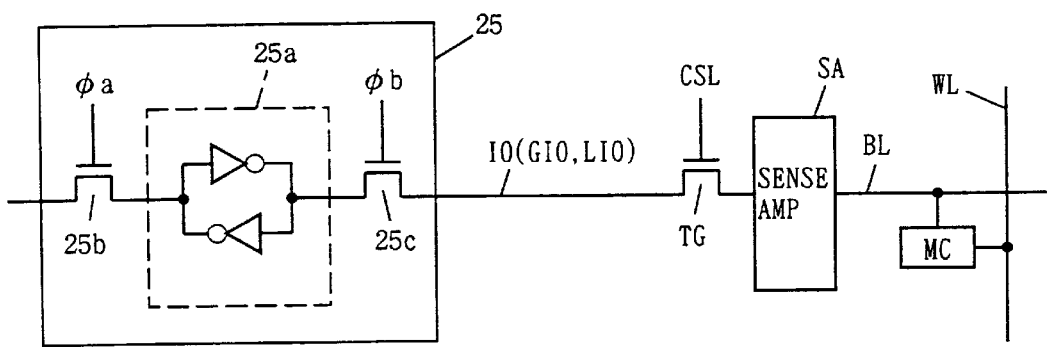
FIG. 8 schematically shows a connection route between a register circuit and a selected memory cell.

FIG. 8 shows a connection between register circuit 25 shown in FIG. 7 and memory cell MC of a memory cell array. In FIG. 8, latch 25a has a configuration of an inverter latch configured of one pair of inverters. Register circuit 25 is connected to column select gate TG of the memory cell array via an internal IO line (global IO line GIO and local IO line LIO). A control gate of column select gate TG receives a column select signal from column select line CSL. Column select gate TG is also connected to bit line BL via sense amplifier SA. Memory cell MC is arranged at an intersection of bit line BL and word line WL. The driving capability (the latching capability) of sense amplifier SA is adapted to be larger than the latching capability of the inverter latch of latch 25a. A data transfer operation via the connection shown in FIG. 8 will now be described with reference to the timing chart shown in FIG. 9.

A data transfer operation from register circuit 25 to memory cell MC will now be described. Latch 25a stores data A. When a DRAM write instruction is applied, a transfer instruction signal φb is activated (i.e. attains a high level in FIG. 8) to turn on connection gate 25c. The data stored in latch 25a is transmitted on internal IO line IO. Then, in response to a write instruction signal and an address signal, a column select signal on column select line CSL is activated (i.e. attains a high level in FIG. 8) to turn on column select gate TG to connect the internal IO line to bit line BL. Since sense amplifier SA is not activated yet, bit line BL selected in response to the column select signal is connected to the internal IO line and the signal potential on bit line BL changes to attain the potential on the internal IO line. A non-selected bit line has a corresponding column select gate TG kept off and is maintained in a precharged state.

Figure 9:
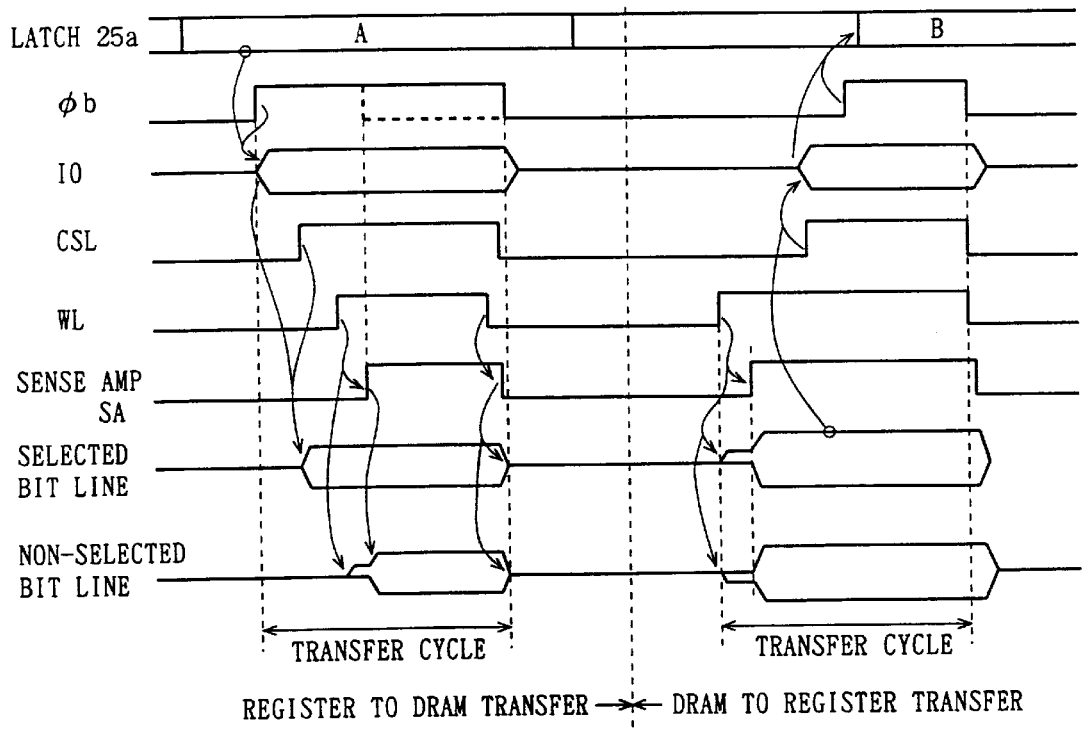
FIG. 9 is a waveform diagram representing an operation in the first embodiment of the present invention.

When the potential on the selected bit line attains a definite state, the potential of word line WL rises and the information stored in memory cell MC is transmitted to the corresponding bit line BL. Since the potential of the selected bit line has been set at the signal potential corresponding to the data transferred from register circuit 25 (latch 25a), even reading the information stored in memory cell MC hardly changes the potential of the selected bit line (the read voltage is extremely small). Meanwhile, the non-selected bit line has its potential changed from the precharged potential in accordance with the information stored in the memory cell. FIG. 9 shows as one example the state in which high-level data is read onto the non-selected bit line. The potential of the selected bit line is indicated as high and low levels, since bit line BL includes paired complementary signal lines. When the potential difference of the non-selected bit line is sufficiently increased, sense amplifier SA is activated to differentially amplify the potential difference caused in each bit line BL. For the selected bit line, the potential corresponding to the data transferred from register circuit 25 is latched by sense amplifier SA. For the non-selected bit line, a potential change to high and low levels is caused according to the potential read on bit line BL.

When sense amplifier SA is activated and then a predetermined period of time elapses, word line WL falls to a low level and the capacitor of memory cell MC is disconnected from bit line BL. Then sense amplifier SA is inactivated and the data (the signal potential) on bit line BL is completely written in memory cell MC (for the non-selected bit line, a restore operation is completed). Also, a signal on column select line CSL is inactivated and column select gate TG is turned off, and transfer instruction signal φb attains an inactive low level and latch 25a of register 25 is disconnected from the internal IO line.

In the data transfer operation from the register to the memory cell (DRAM), transfer instruction signal φb may be inactivated while sense amplifier SA is activated (this timing is indicated by a broken line in FIG. 9). Connecting the latch 25a to a selected bit line BL to transfer the transfer data to the selected bit line BL followed by activation of sense amplifier SA ensures that data reliably is transmitted from register circuit 25 into memory cell MC in DRAM memory cell array 1 even when the driving capability of sense amplifier SA is larger than the latching capability of latch 25a.

In transferring data from the register to the DRAM, as shown in FIG. 9, it is not problematic if word line WL is driven to a selected state at an earlier timing than activation of column select signal CSL, since non-selected bit lines are not connected to internal IO lines and only a selected bit line is connected to an internal IO line.

The data transfer operation from the DRAM memory cell array to the register will now be described. In transferring data from the DRAM to the register, word line WL is initially driven to a selected state and both of selected and non-selected bit lines have their potentials changed from the precharged potential in accordance with the information stored in the corresponding memory cells MCs. FIG. 9 shows an exemplary potential change when memory cell MC of a selected bit line stores high-level data and memory cell MC connected to a non-selected bit line stores low-level data.

Then, sense amplifier SA is activated and the potential difference on bit line BL is sensed, amplified and latched. When the bit line potential amplifying and latching operations by sense amplifier SA are completed, a column select signal on column select line CSL is activated and column select gate TG is turned on. Thus, a selected bit line BL is connected to an internal IO line and the potential of the internal IO line changes to the potential level corresponding to the potential of the selected bit line BL. Then, when the potential on the internal IO line IO is stabilized, transfer instruction signal φb is activated and the data on the internal IO line IO is transferred to latch 25a and latch 25a latches data B stored by the selected memory cell MC.

In transferring data from the DRAM memory cell array to the register, sense amplifier SA of the DRAM is activated at an earlier timing than activation of transfer instruction signal φb for register circuit 25. Sense amplifier SA activated to have a driving capability larger than the latching capability of latch 25a ensures that the data stored by memory cell MC is reliably latched by latch 25a.

The data transfer between registers 20 and 22 shown in FIG. 6 is performed conditioned that the column select signals on column select lines CSLs are each in an inactive state. The configuration of a control for performing the transfer between the registers is readily implemented by the configuration in which the permission/non-permission for data transfer between the registers is determined depending on the decision result of whether a column decoder enable signal for activating a column decoder of the DRAM is in an active or in inactive state.

Modification of the Register Circuit

Figure 10:
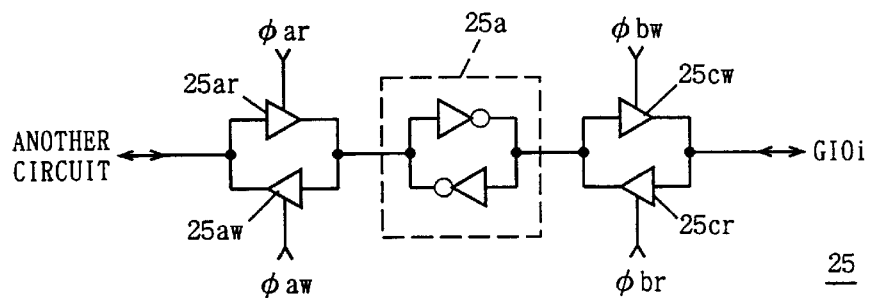
FIG. 10 schematically shows the configuration of a first modification of the register circuit included in the register shown in FIG. 6.

FIG. 10 shows the configuration of a modification of register circuit 25 included in registers 20 and 22 shown in FIG. 6. In FIG. 10, register circuit 25 includes: latch 25a for latching the data supplied thereto; a tristate buffer 25ar activated in response to activation of a read transfer instruction signal φar to amplify the data received from another circuit and transfer the amplified data to latch 25a; a tristate buffer 25aw activated in response to activation of a write transfer instruction signal φaw to transfer the data latched by latch 25a to another circuit; a tristate buffer 25cw activated in response to activation of a write transfer instruction signal φbw to transmit the data latched by latch 25a onto global IO line GIOi; and a tristate buffer 25cr activated in response to activation of a read transfer instruction signal φbr to amplify the data on global IO line GIOi and transfer the amplified data to latch 25a.

Tristate buffers 25ar, 25aw, 25cw and 25cr each attain an output high impedance state when they are inactivated. The respective driving capabilities of tristate buffers 25ar and 25cr are adapted to be larger than that of latch 25a. The driving capability of tristate buffer 25cw is adapted to be larger than the latching capability of sense amplifier SA included in the DRAM array. A data transfer operation between register circuit 25 shown in FIG. 10 and a DRAM array will now be described with reference to the operation waveform diagram shown in FIG. 11. FIG. 8 is also referred to, since the connection route between register circuit 25 and a DRAM memory cell is the same as that shown in FIG. 8.

Figure 11:
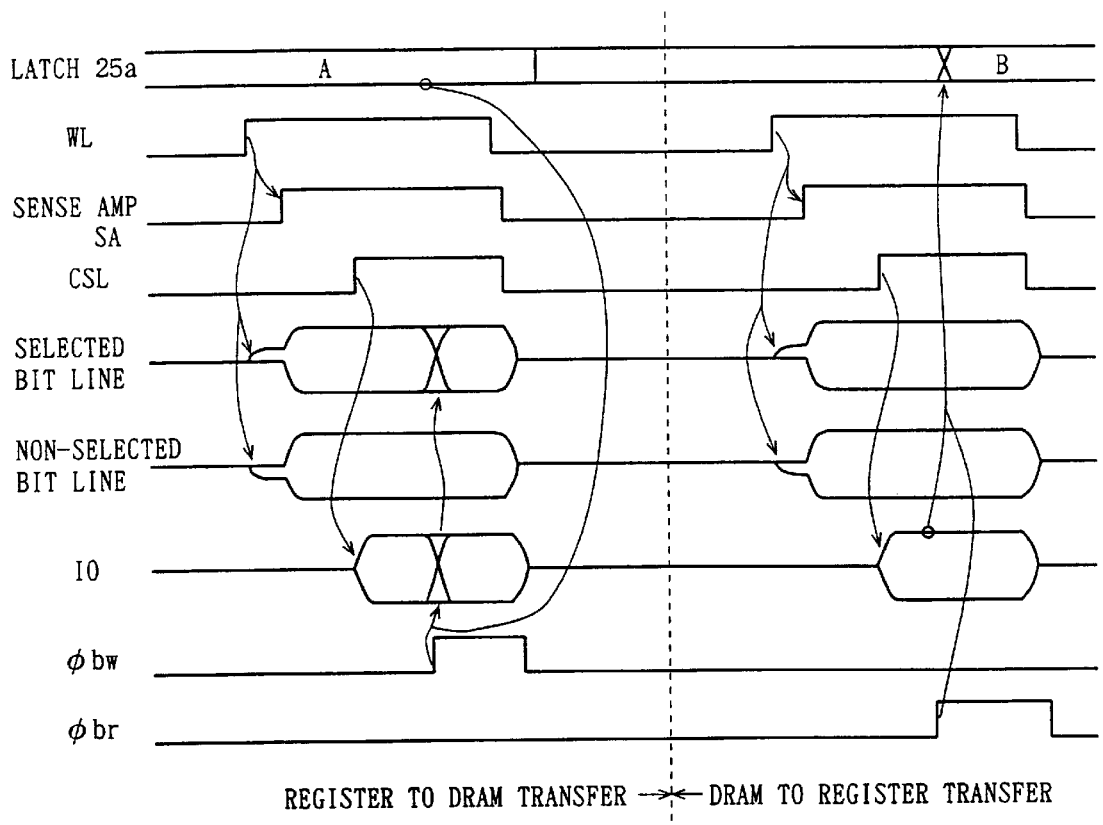
FIG. 11 is a waveform diagram representing a data transfer operation between a register and a memory cell selected in a DRAM memory cell array.

A data transfer from the register to a DRAM memory cell will now be described. In a DRAM memory cell array, according to a data write instruction, a word line WL is driven to a selected state in response to an applied address signal. Then, in response to a rise in potential of the selected word line WL, the data in a memory cell connected to the word line WL is transmitted on a corresponding bit line. FIG. 11 shows an exemplary bit line potential change when a memory cell MC connected to a selected bit line (i.e. a bit line which receives data transfer) stores high-level data therein and a memory cell connected to a non-selected bit line (i.e. a bit line which does not receive data transfer) stores low-level data therein.

Then, sense amplifier SA is activated and the potential of the bit line is sensed, amplified and latched. When the sense operation by sense amplifier SA is completed and the potential of each bit line is defined, a column select signal on column select line CSL is activated. Thus a selected bit line is connected to an internal IO line and the data on the selected bit line (i.e. the data having been latched by a sense amplifier) is transmitted on the internal IO line. Then, write transfer instruction signal φbw is activated to activate tristate buffer 25cw and the data stored at latch 25a is transmitted to the selected bit line via the internal IO line.

Since the driving capability of tristate buffer 25cw is larger than that of sense amplifier SA, the potential of the selected bit line changes to that corresponding to the data stored at latch 25a. When the potential of the selected bit line changes depending on the transferred data and is then stabilized, the data is completely written in a memory cell and word line WL is driven to a non-selected state and then sense amplifier SA is put in an inactive state. Also, the column select signal on column select line CSL is put in a non-selected state and each bit line is disconnected from internal IO line IO and is also precharged to a predetermined potential level. Write transfer instruction signal φbw is also put in an inactive state and tristate buffer 25cw is put in an inactive state and attains an output high impedance state. The activation period of write transfer instruction signal φbw needs only to be the period in which the potential of a selected bit line changes to a potential level corresponding to transmitted written data and is then stabilized, i.e. the time for which the data latched by a sense amplifier changes depending on the write data and is then stabilized.

A data transfer operation from the DRAM array to the register will now be described. In the transfer from the DRAM memory cell array to the register also, a memory cell select operation in the DRAM array is performed according to a data transfer instruction. More specifically, as is similar to the data transfer operation from the register to the DRAM, word line WL is initially driven to a selected state and sense amplifier SA is then activated. Thus the potential of each bit line is held at the potential level corresponding to the data stored in a memory cell. When the potential of the bit line is stabilized, an active column select signal is provided on column select line CSL to turn on column select gate TG and the potential of a selected bit line (latched by sense amplifier SA) is transmitted on internal IO line IO. When the potential on internal IO line IO changes to and stabilizes at the potential level corresponding to the potential of the selected bit line, read transfer instruction signal φbr is activated (i.e. attains a high level in FIG. 11) to activate tristate buffer 25cr, and the signal potential on internal data line IO is amplified and transmitted to latch 25a. Thus the data of a selected memory cell is latched by latch 25a.

For the configuration shown in FIG. 10, the same memory cell select sequence (the timing at which each signal is activated) is applied regardless of the direction of data transfer between the register and the DRAM memory cell array. Accordingly, when an instruction to access the DRAM array is applied, starting a memory cell select operation is only required and it is not necessary to vary the timing of activation of each signal depending on the mode of operation, resulting in easy control.

Furthermore, the respective timings at which a signal on word line WL, sense amplifier SA and a column select signal on column select line CSL are activated are the same as those in conventional DRAMs, and any complicated changes in design are not required. Furthermore, DRAM sense amplifier SA is only required to have a capability to drive internal IO line IO depending on the potential on the corresponding bit line and is not required to have large driving capability, so that the area occupied by sense amplifiers can be reduced.

Latch 25a is also only required of the capability to simply hold the received data and is not required of large latching capability. In the transfer between the registers, write transfer instruction signal φbw is activated in one of registers 20 and 22 and read transfer instruction signal φbr is activated in the other of registers 20 and 22. This allows that data transfer from one register to the other register via global IO line GIOi.

Second Modification of the Register Circuit

Figure 12:
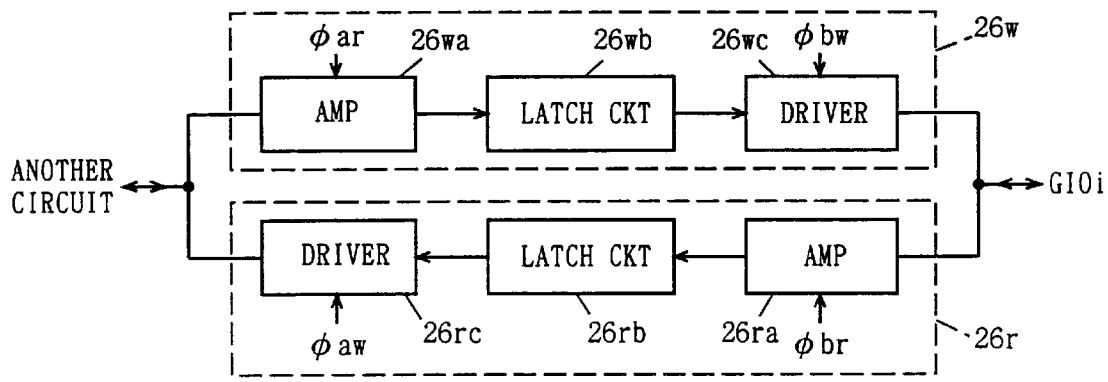
FIG. 12 shows the configuration of a second modification of the register circuit included in the register shown in FIG. 6.

FIG. 12 shows the configuration of a second modification of the register circuit included in registers 20 and 22 shown in FIG. 6. In FIG. 12, register circuit 25 includes a write buffer 26w latching the data supplied from another circuit and transmitting the latched data on global IO line GIOi, and a read buffer 26r latching the data on global IO line GIi and transferring the latched data to another circuit. Write buffer 26w and read buffer 26r are provided in parallel between a data bus line to another circuit and global IO line GIOi.

Write buffer 26w includes: an amplifier 26wa activated in response to activation of read transfer instruction signal φar to amplify the data received from another circuit; a latch circuit 26wb latching the data amplified by amplifier 26wa; and a driver 26wc activated in response to activation of write transfer instruction signal φbw to transmit the data latched by latch circuit 26wb on global IO line GIOi. Driver 26wc is larger in driving capability than sense amplifiers of the DRAM memory cell array and rapidly drives global IO line GIOi to the potential level corresponding to the data latched by latch circuit 26wb.

Read buffer 26r includes: an amplifier 26ra activated in response to activation of read transfer instruction signal φbr to amplify the data on global IO line GIOi; a latch circuit 26rb latching the data amplified by amplifier 26ra; and a driver 26rc activated in response to activation of write transfer instruction signal φbw to transmit the data latched by latch circuit 26rb to another circuit. Driver 26rc also rapidly drives the data bus line to another circuit. Drivers 26wc and 26rc are each put in an output high impedance state when they are inactivated. Latch circuits 26wb and 26rb is only required of the function of latching the supplied data are each formed, for example, of such an inverter latch as shown in FIG. 10. Transfer instruction signals φar, φbw, φbr and φaw are the same as those shown in FIG. 10. Accordingly, the data transfer operation between the register circuit and the DRAM shown in FIG. 12 is the same as the operation represented in the operation waveform diagram shown in FIG. 11.

The provision of read and write buffers 26r and 26w, as shown in FIG. 12, allows latching the data received from another circuit in parallel with latching the data on global IO line GIOi, resulting in improved data transfer efficiency.

As described above, in the first embodiment of the present invention, each global IO line GIOi as an internal data line of a DRAM memory cell array is provided with a register circuit for data transfer, the data transfer between registers can be performed via an internal data bus (the global IO line) of the DRAM to reduce the area occupied by interconnection lines. Furthermore, owing to the provision of registers along two opposite sides in the direction in which the global IO line of the DRAM array extends interregister distance can be made, minimum leading to rapid data transfer.

Second Embodiment

Figure 13:
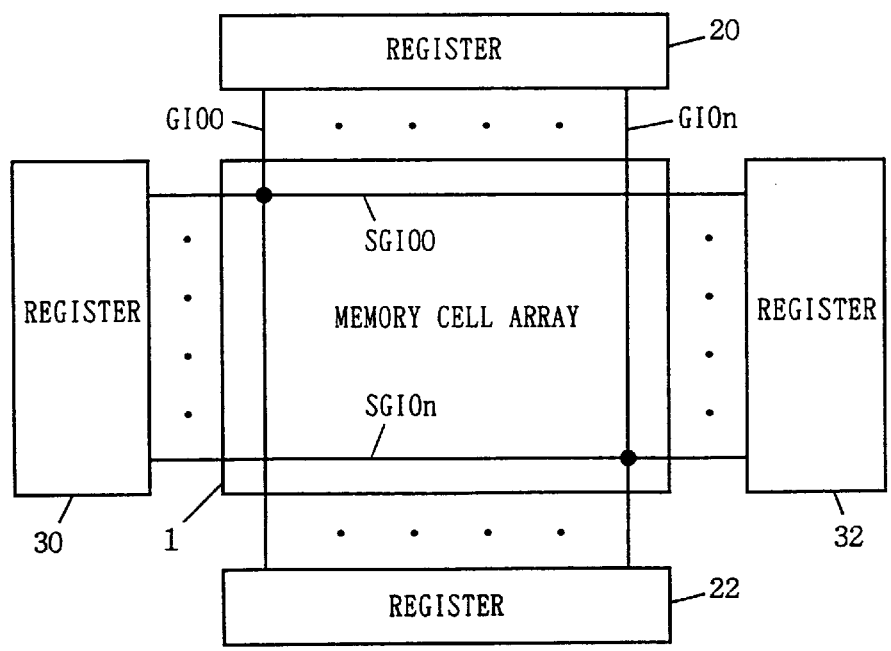
FIG. 13 schematically shows the configuration of a main portion of a memory integrated circuit device according to a second embodiment of the present invention.

FIG. 13 schematically shows the configuration of a main portion of a memory integrated circuit device according to a second embodiment of the present invention. In addition to registers 20 and 22 connected to global IO lines GIO0 to GIOn, registers 30 and 32 are also arranged along the opposite sides in the row direction of memory cell array 1 in the integrated circuit device shown in FIG. 13. Registers 30 and 32 are the same in configuration as registers 20 and 22, and may have any configuration of the register circuits described in the first embodiment. Registers 30 and 32 are interconnected via subglobal IO lines SGIO0 to SGIOn arranged extending over memory cell array 1 in the row direction. Registers 30 and 32 each include a register circuit arranged for each of subglobal IO lines SGIO0 to SGIOn. Subglobal IO lines SGIO0 to SGIOn are respectively connected to global IO lines GIO0 to GIOn.

Figure 14:
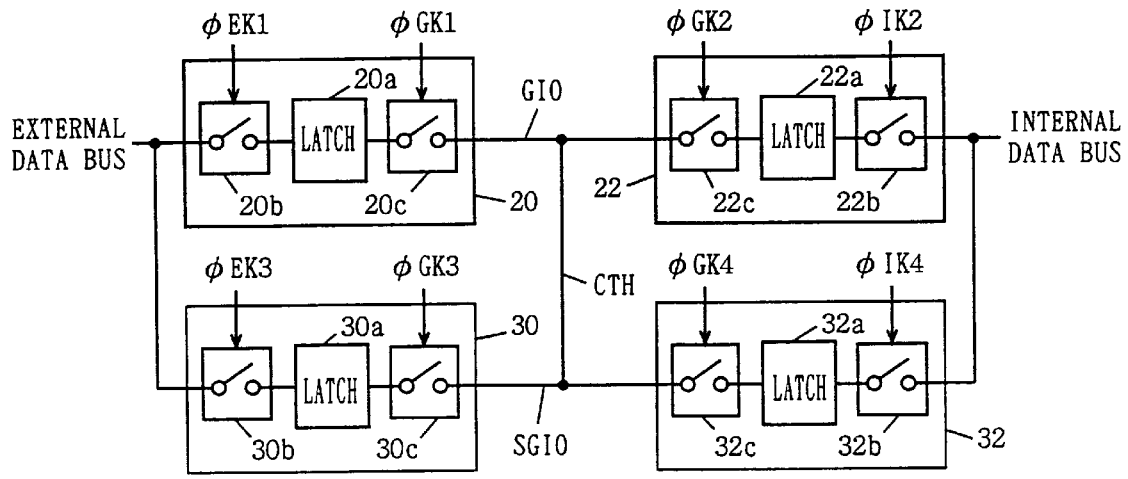
FIG. 14 schematically shows a connection between registers arranged as shown in FIG. 13.

FIG. 14 schematically shows an interconnection between registers in the register arrangement shown in FIG. 13. In FIG. 14, registers 20 and 22 are interconnected via a global IO data bus GIO including global IO lines GIO0 to GIOn. Registers 30 and 32 are interconnected via a subglobal 10 data bus SGIO including subglobal IO lines SGIO0 to SGIOn.

Global IO data bus GIO and subglobal IO data bus SGIO are interconnected via contacts CTH. Registers 20 and 30 are connected to a device external to the memory integrated circuit device via an external data bus. Registers 22 and 32 are connected to an internal circuit (a logic, or a processor) via an internal data bus.

Registers 20, 22, 30 and 32 have any configuration described in the first embodiment. In FIG. 14, a driver, amplifier or gate is illustratively shown as a switching element.

Register 20 includes: a latch 20a; a switching element 20b activated in response to a transfer instruction signal φEK1 to transfer data between the external data bus and latch 20a; and a switching element 20c activated in response to a transfer instruction signal φGK1 to transfer data between latch 20a and global IO data bus GIO. Register 22 includes: a latch 22a; a switching element 22b activated in response to a transfer instruction signal φIK2 to transfer data between the internal data bus and latch 22a; and a switching element 22c activated in response to activation of a transfer instruction signal φGK2 to transfer data between latch 22a and global IO data bus GIO.

Register 30 includes: a latch 30a; a switching element 30b activated in response to activation of a transfer instruction signal φEK3 to transfer data between latch 30a and the external data bus; and a switching element 30c activated in response to activation of a transfer instruction signal φGK3 to transfer data between latch 30a and subglobal IO data line SGIO.

Register 32 includes: a latch 32a; a switching element 32b activated in response to activation of a transfer instruction signal φIK4 to transfer data between the internal data bus and latch 32a; and a switching element 32c activated in response to activation of a transfer instruction signal φGK4 to transfer data between latch 32a and subglobal IO data bus SGIO. The data transfer from register 20 to registers 22, 30 and 32, and the operation of writing data into a DRAM memory cell will now be described with reference to the timing chart shown in FIG. 15.

When data (A) is supplied on the external data bus and a signal instructing that data (A) is to be taken in is applied, transfer instruction signal φEK1 attains an active high level at time t1 and latch 20a latches data (A) on the external data bus. When an instruction of transfer between registers or an instruction of writing in the DRAM is then supplied, transfer instruction signal φGK1 attains an active high level at time t2 and switching element 20c drives global IO data bus GIO and subglobal SGIO to transmit data (A) on data buses GIO and SGIO. When a command to transfer data between registers is applied, transfer instruction signals φGK2 and φGK4 are each attain an active high level at time t3 to cause data (A) to be transferred to and latched by latches 22a and 32a conditioned that the DRAM array is not accessed. When a command is then supplied that the data be written into the DRAM, a word line is driven to a selected state and a column select signal on column select line CSL is also driven into a selected state at time t4 and data (A) is written in an addressed memory cell. At time t5, at which the data is written in the DRAM memory cell, transfer instruction signal φGK1 is put in an inactive state. The latching of the write data by a sense amplifier in the DRAM memory cell array ensures that the data is reliably written in the DRAM even if transfer instruction signal φGK1 is driven to an inactive state with a word line and column select line CSL in a selected state.

In reading data and transferring data between registers, a sequence similar to that in the first embodiment is employed, and read the data of a selected memory cell is read onto data buses GIO and SGIO and then a switching element of the register is activated to which the data is transferred.

The arrangement of a plurality of registers (four registers in FIG. 3) along the periphery of a DRAM array allows the operation of writing data from the external data bus into register 20 to be performed in parallel with the operation of writing data from register 30 into the DRAM. Registers 20 and 30 can be alternately used to efficiently write external data into the DRAM, for example. Registers 22 and 32 can also be alternately used to allow rapid data transfer between a logic such as a processor connected to the internal data bus and the DRAM.

As an alternative to the arrangement that registers 20 and 30 commonly coupled with the external data bus and registers 22 and 32 commonly coupled with the internal data bus as shown in FIG. 14 if register 20 is coupled only with the external data bus while registers 20, 30 and 32 are connected to the respective individual internal data buses, each internal logic can be arranged adjacent to each register to efficiently transfer required data between a logic (e.g. a processor) and a register.

As has been described above, in the second embodiment of the present invention, registers are provided respectively arranged along the four sides of a DRAM array and an internal circuit is arranged for each register, allowing rapid data transfer between the internal circuits and the DRAM array. Furthermore, externally applied data can be written into the DRAM memory cell array and also transferred via an internal data bus to an internal circuit (a logic such as a processor). Thus it is not necessary to first write the externally applied data into the DRAM and then again access the DRAM to transfer the written data to the internal circuit, resulting in efficient data transfer.

Figure 15:
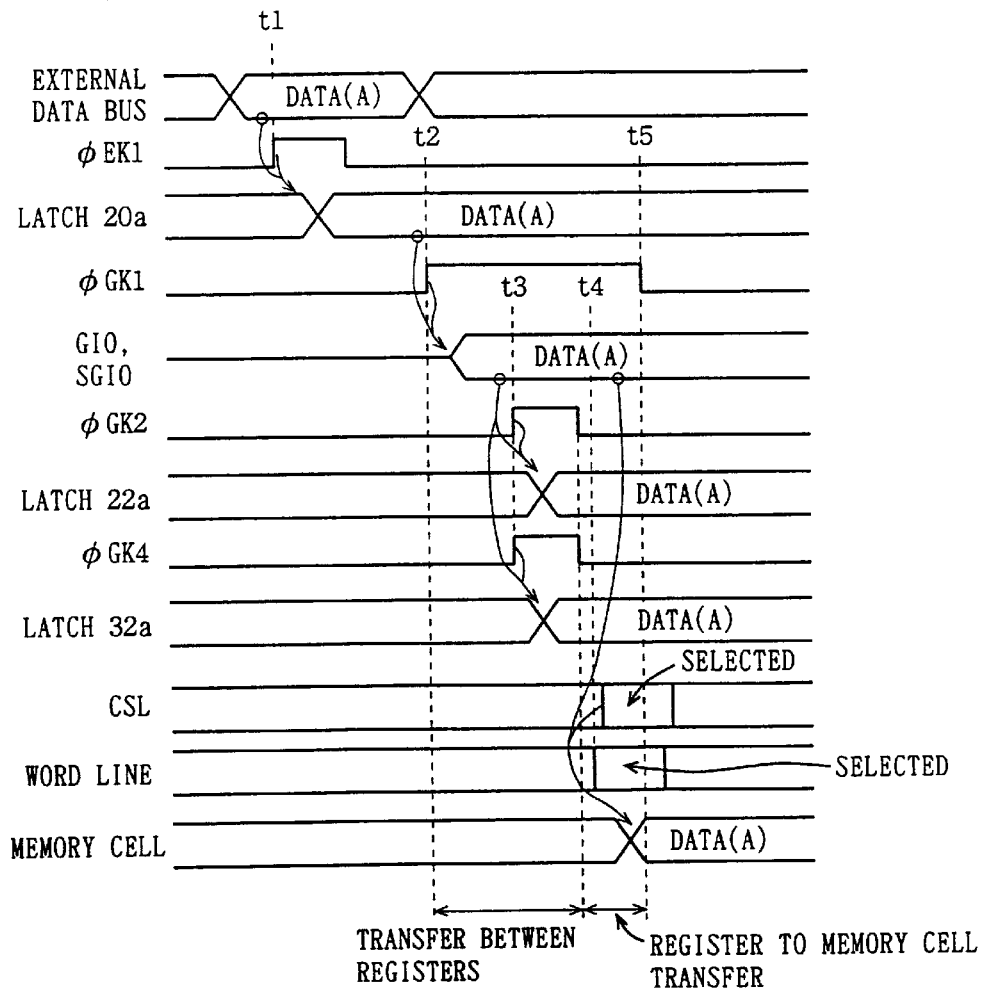
FIG. 15 is a waveform diagram representing an exemplary data transfer operation in the register arrangement shown in FIG. 13.

The generation of the transfer instruction signals shown in FIGS. 14 and 15 will be described later.

Third Embodiment

Figure 16:
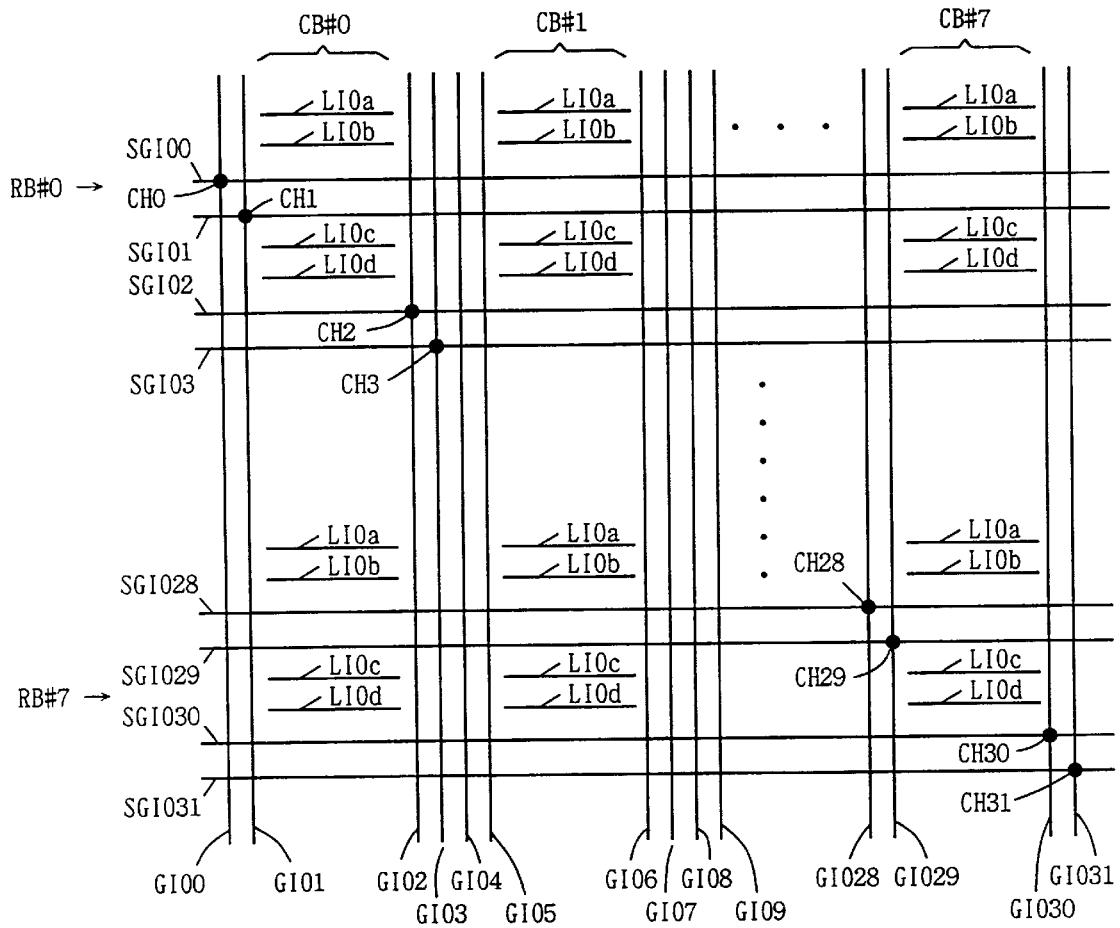
FIG. 16 is a bus arrangement for connecting the registers shown in FIG. 13.

FIG. 16 schematically shows an arrangement of subglobal IO lines, global IO lines and local IO lines. In FIG. 16, a memory cell array is exemplarily divided into eight row blocks RB#0 to RB#7 and eight column blocks CB#0 to CB#7. Each subarray block (not shown) is provided with four local IO lines LIOa to LIOd. As is similar to the first embodiment, global IO lines GIO0 to GIO31 are arranged in word line shunt regions, four global IO lines for each column block.

Subglobal IO lines SGIO0 to SGIO31 are formed parallel to local IO lines LIOa to LIOd in the same interconnection layer. Thus, subglobal IO lines SGIO0 to SGIO31 are dispersed such that four subglobal IO lines are arranged for one row block. Subglobal IO lines SGIO0 to SGIO31 are electrically connected to global IO lines GIO0 to GIO31 via contacts CH0 to CH31, respectively.

Figure 17:
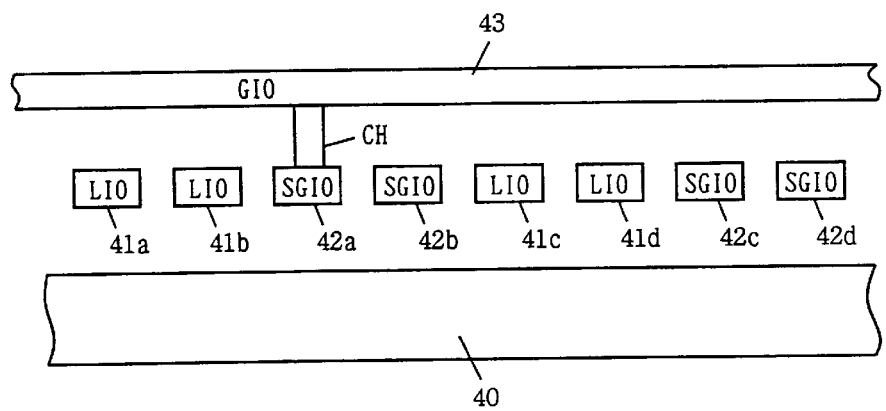
FIG. 17 schematically shows an arrangement of interconnection layers for interconnections between registers.

FIG. 17 schematically shows a relation between the interconnection layers for the IO lines in the bus arrangement shown in FIG. 16. In FIG. 17, local IO interconnection lines 41a, 41b, 41c and 41d formed in e.g. a first level metal (e.g. aluminum) interconnection layer are formed above a semiconductor substrate 40. Global IO bus interconnection lines 42a and 42b similarly formed in the first level metal (e.g. aluminum) interconnection layer are arranged between local IO lines 41b and 41c, and subglobal IO interconnection lines 42c and 42d formed in the first level metal (e.g. aluminum) interconnection layer are arranged adjacent to local IO interconnection line 41d. A global IO interconnection line (GIO) 43 is formed above interconnection lines 41a to 41d and 42a to 42d in e.g. a second level metal (e.g. aluminum) interconnection layer and is connected to subglobal IO interconnection line 42a via a contact material CH formed of metal such as aluminum. Subglobal IO lines 42b, 42c and 42d are connected in a region (not shown) to respective global IO interconnection lines via a similar contact material CH. The aluminum interconnection line may be substituted with another metal interconnection line.

By arranging local IO lines LIOa to LIOd and subglobal IO lines SGIO0 to SGIO31 in the same interconnection layer as shown in FIG. 17, the necessity of additional interconnection layer for the subglobal IO lines can be eliminated and the increase of process cost due to addition of interconnection layers can be suppressed.

Modification

Figure 18:
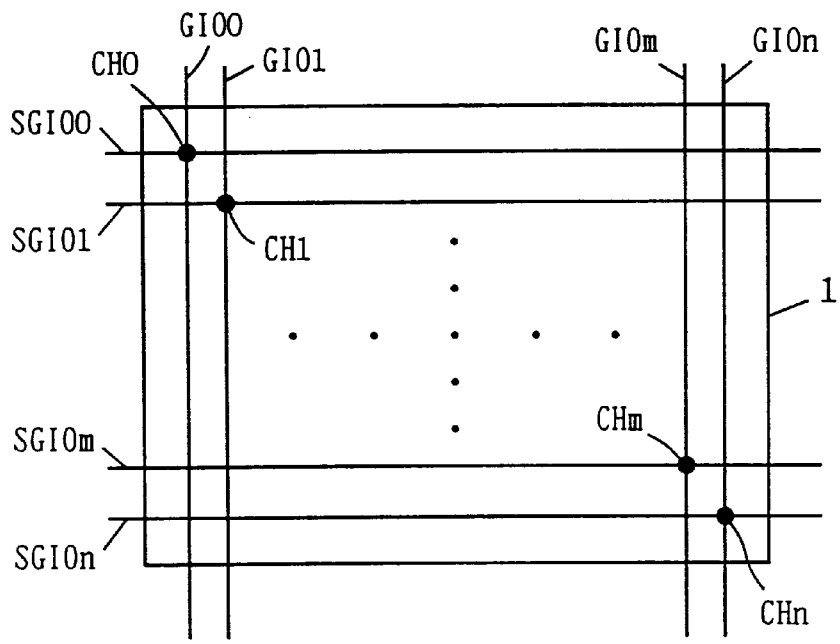
FIG. 18 shows another arrangement of buses connecting registers in a third embodiment.

FIG. 18 shows a modification of subglobal IO line arrangement. In FIG. 18, global IO lines GIO0 to GIO0n are arranged in word line shunt regions to memory cell array 1. Subglobal IO lines SGIO0 to SGIOn formed in an interconnection layer that is not used in memory cell array 1 are arranged dispersedly over memory cell array 1. Subglobal IO lines SGIO0 to SGIOn are connected to global IO lines GIO0 to GIOn via contact materials CH0 to CHn, respectively. Subglobal IO lines SGIO0 to SGIOn formed in an interconnection layer different from the interconnection layers used in memory cell array 1 can be arranged over memory cell array 1 at appropriate spaces in a dispersed manner.

Figure 19:
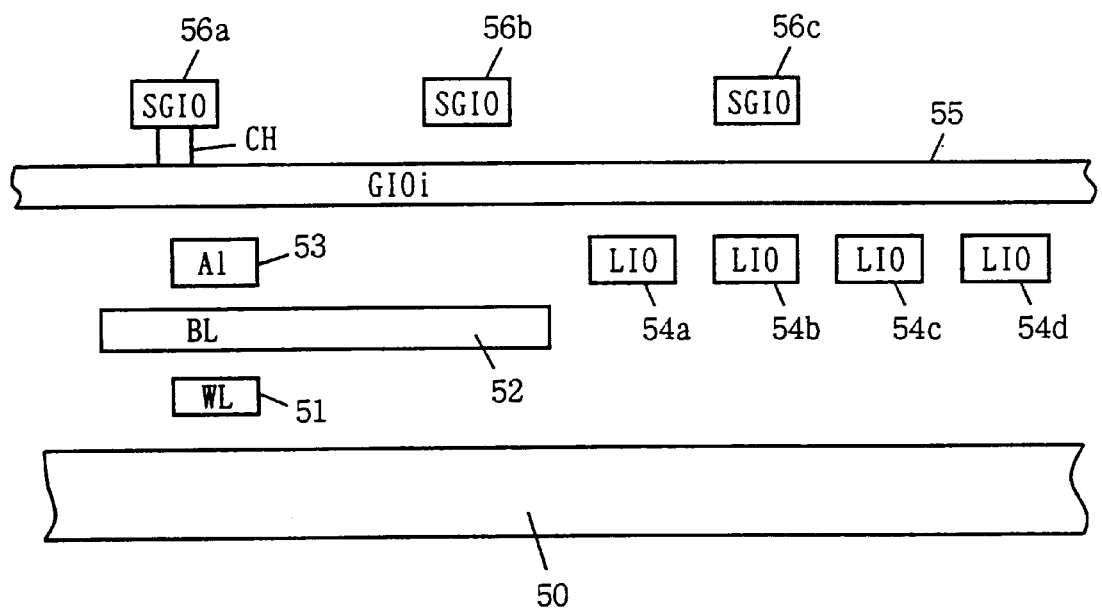
FIG. 19 schematically shows a relation between bus interconnection layers in the bus arrangement shown in FIG. 18.

FIG. 19 schematically shows a relation between the interconnection layers in the subglobal IO line arrangement shown in FIG. 18. In FIG. 19, a first level polysilicon interconnection line 51 as word line WL is provided above a semiconductor substrate 50. A second level polysilicon interconnection line 52 as bit line BL is arranged above the first level polysilicon interconnection line 51. A first level metal (e.g. aluminum) interconnection line (AL) 53 for reducing the resistance of word line WL is provided above the second level polysilicon interconnection line 52. The first level metal (e.g. aluminum) interconnection lines 54a to 54d as local IO line LIO are arranged in the first level metal (e.g. aluminum) interconnection layer at predetermined spaces. The second level metal (e.g. aluminum) interconnection line 55 as global IO line GIOi is provided above the first level metal (e.g aluminum) interconnection lines 53 and 54a to 54d.

Third level metal (e.g. aluminum) interconnection lines 56a, 56b and 56c as subglobal IO lines SGIO are provided above the second level metal (e.g. aluminum) interconnection line 55 at a predetermined spacing. The third level metal interconnection line 56a is connected to the second level metal interconnection line 55 via contact material CH.

Since the interconnection lines for subglobal IO lines SGIO0 to SGIOn are formed in the third level metal interconnection layer, as shown in FIG. 19, subglobal IO lines SGIO0 to SGIOn can be arranged without affecting the layout in memory cell array 1. Furthermore, it is not necessary to arrange subglobal IO lines between interconnection lines 54a to 54d for local IO lines, so that the layout area for the local IO lines can be reduced.

It should be noted that the relation between the interconnection layers shown in FIG. 19 does not represent the precise cross-sectional structure thereof, since global IO line GIOi is provided in a word line shunt region, in which region bit line BL is not provided and the first level metal interconnection line 53 and the first level polysilicon interconnection line 51 are connected together.

It should be noted that the interconnection layer for subglobal IO lines need not be the third level metal interconnection layer. It may be any interconnection layer that is not used in memory cell array 1, and may be formed underlying the second level metal (e.g. aluminum) interconnection line 55 of the global IO line.

As has been described above, in the third embodiment of the present invention, registers are arranged opposite to each other in the row direction of memory cell array 1 and are interconnected via subglobal IO lines parallel to local IO lines. The registers can be interconnected at the minimum distance to implement rapid data transfer between the registers. Furthermore, formation of the subglobal IO line and the local IO line in the same interconnection layer can eliminate the necessity for an additional interconnection layer to reduce an increase in the process cost otherwise associated with addition of the interconnection layer. Furthermore, formation of the subglobal IO line in an interconnection layer which in turn is not used in memory cell array 1 allows the subglobal IO line to be provided without affecting the layout of memory cell array 1 and thus allows interconnection lines to be readily laid out. It is also not necessary to provide subglobal IO lines between local IO lines, resulting in reduction of the layout area for the local IO lines.

Fourth Embodiment

Figure 20:
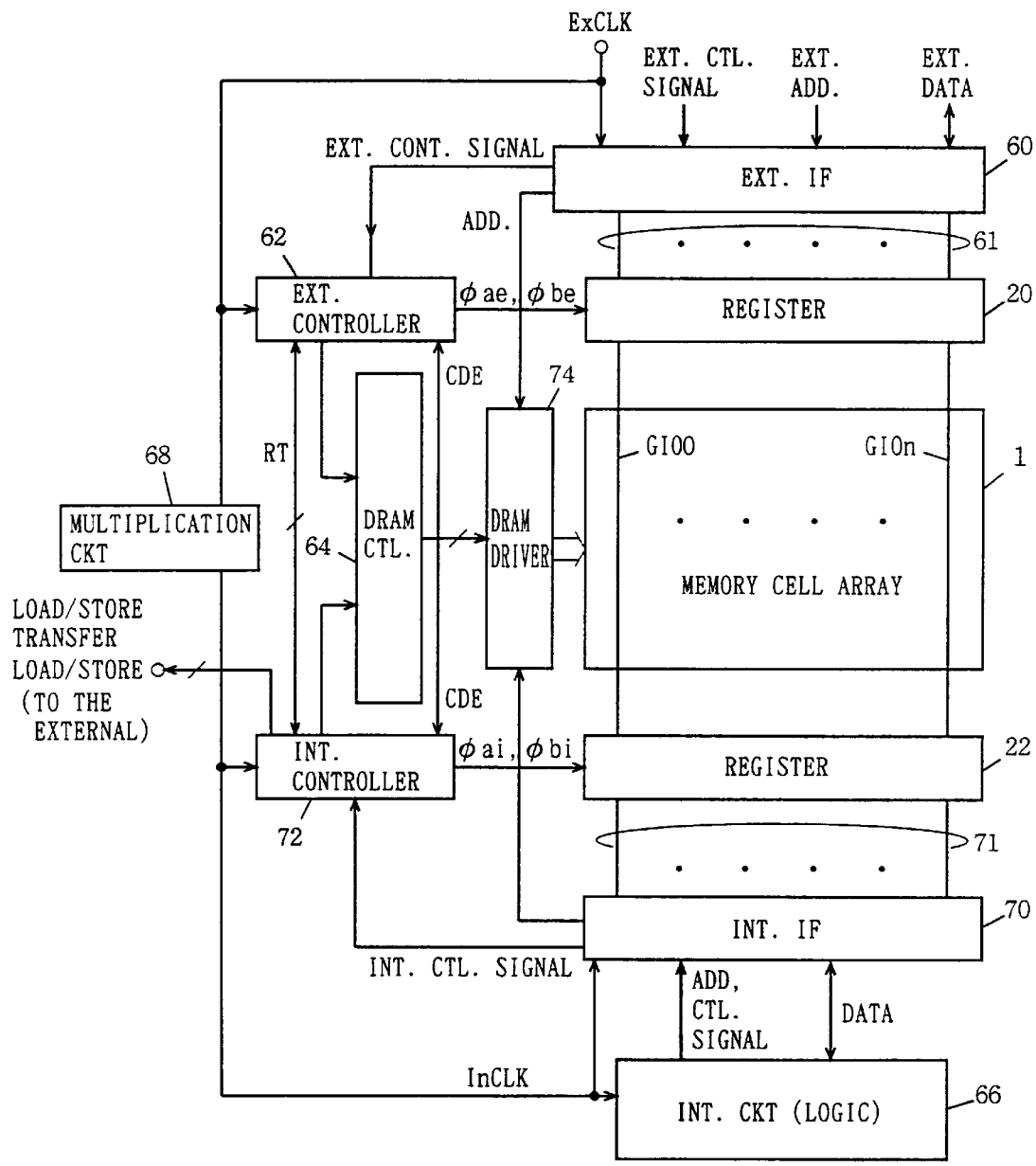
FIG. 20 schematically shows the configuration of a main portion of a memory integrated circuit device according to a fourth embodiment of the present invention.

FIG. 20 schematically shows the entire configuration of a memory integrated circuit device according to a fourth embodiment of the present invention. In FIG. 20, registers 20 and 22 are arranged opposite to each other on both sides with respect to the column direction of DRAM memory cell array 1. Registers 20 and 22 are connected to global IO lines GIO to GIOn of internal data bus lines in DRAM memory cell array 1. The configuration of registers 20 and 22 and the configuration of memory cell array 1 are the same as those described in the first embodiment.

The memory integrated circuit device also includes an external interface 60 for providing interface between register 20 and an external. External interface 60 receives an externally applied external control signal and an externally applied external address signal in synchronization with an external clock signal ExCLK and produces a buffered external control signal and an buffered external address signal. External interface 60 also reads and writes external data in synchronization with external clock signal ExCLK. External interface 60 only transmits and receives data to and from register 20 and does not transfer the external control signal or the external address signal to register 20.

The memory integrated circuit device also includes an external controller 52 for decoding an external control signal from external interface 60 to produce transfer control signals φae and φbe which in turn controls the data transfer operation of register 20. When external controller 62 decodes an external control signal and the result of decoding indicates an access to DRAM array 1, external controller 62 produces a control signal indicating a designated operation for DRAM 1 and applies the produced control signal to a DRAM control 64. The configuration of DRAM control 64 will be described in detail later.

The memory integrated circuit device also includes an internal circuit (logic) 66 which has data processing function and the function of generating the access instruction to and address signals for the DRAM. Internal circuit (logic) 66 includes, for example, a processor. Internal circuit 66 operates in synchronization with an internal clock signal InCLK received from a multiplication circuit 68 which in turn performs a frequency-multiplication of external clock signal ExCLK. External controller 62 operates in synchronization with external clock signal ExCLK. Clock signals ExCLK and InCLK are synchronized with each other.

Provided between register 22 and internal circuit 66 is an internal interface 70 which in turn is similar in configuration to external interface 60. Internal interface 70 takes in an address signal and a control signal received from internal circuit 66 synchronously with internal clock signal InCLK, and also transmits and receives data to and from internal circuit 66 in synchronization with internal clock signal InCLK. Internal interface 70 applies the received address signal and control signal to an internal controller 72.

Internal controller 72 produces transfer control signals φai and φbi for controlling the data transfer operation of register 22 in accordance with the internal control signal decoded by internal controller 72 in synchronization with internal clock signal InCLK from multiplication circuit 68.

Internal controller 72 also applies a control signal instructing a designated operation mode to DRAM control 64 when an internal control signal decoded by internal controller 72 instructs an access to DRAM array 1.

DRAM control 64 provides access arbitration as required according to the access instruction signals from external and internal controllers 62 and 72 and drives a DRAM driver 74 according to the designated operation mode. DRAM driver 74 includes: a row decoder for selecting a word line of DRAM array 1 and a column decoder driving a column select line; a sense amplifier activating circuit for activating a sense amplifier; a bit line precharger/equalizer circuit precharging a bit line to a predetermined potential; and array periphery circuitry generating the control signals to said circuits. A column decode enable signal CDE which activates the column decoder included in DRAM driver 74 is also applied from DRAM control 64 to external and internal controllers 62 and 72. When external and internal controllers 62 and 72 receive an activated column decode enable signal CDE, data transfer is prohibited between the registers via global IO lines GIO0 to GIOn.

Also a state-of-transfer indication RT indicative of the state of data transfer is transmitted and received between external and internal controllers 62 and 72. Indication (a flag or bit) of the state of data transfer RT is employed to determine in data transfer between the registers whether a data-source register drives global IO lines GIO0 to GIOn in accordance with the transfer data and to set a destination register to a data write state after global IO lines GIO0 to GIOn are driven. The transmission and reception of the state-of-data transfer indication RT between external and internal controllers 62 and 72 ensures the reliable data transfer between the registers.

In FIG. 20, internal controller 72 is also shown providing a load/store signal and a load/store transfer signal to the external. The load/store signal directs the loading/storing of data between the DRAM array and an external device. The load/store transfer signal indicates the loading/storing of data between the internal circuit and the external device. In response to the load/store signal or the load/store transfer signal, a controller externally provided sets external control signals to respective predetermined states. The load/store signal and the load/store transfer signal are generated to internal circuit 66, such as a processor, performing a processing according to a program. The load/store transfer signal and the load/store signal are not particularly required for repetitively performing a data processing normally in a predetermined order as done in image data processing. The external controller controls the operation of loading/storing data in the DRAM array at a predetermined timing.

Since external controller 62 operating in response to external control signals and internal controller 72 operating in response to internal control signal are provided for registers 20 and 22, conflict of the controls according to the external and internal control signals can be avoided for each of registers 20 and 22 to accurately transfer data and write/read data to/from the DRAM array. The data transfer operation between the registers of the memory integrated circuit device shown in FIG. 20, and the data write operation to the DRAM array will now be described with reference to the timing chart shown in FIG. 21.

The data write operation to the DRAM memory cell array will now be described.

Write data (WD) has already been stored in register 20. An external control signal is set in a DRAM write instruction state instructing writing data to the DRAM memory cell array. In clock cycle #1, external interface 60 takes in and applies the external control signal to external controller 62 in synchronization with a low to high transition of external clock signal ExCLK. A DRAM address of the DRAM memory cell array that designates an address to which the data is written is also provided and is similarly taken in by external interface 60 synchronously with the low to high transition of external clock signal ExCLK in clock cycle #1 and applied to DRAM driver 74.

External controller 62 responds to the external control signal instructing DRAM write, to provide to DRAM control 64 a signal instructing writing the data. Simultaneously, external controller 62 activates transfer instruction signal φbe to transfer the write data from register 20 on global IO lines GIO0 to GIOn. In response to the activated transfer instruction signal φbe, register 20 transmits the stored written data (WD) on global IO line GIO.

DRAM driver 74 is controlled by DRAM control 64, to drive to a selected state a column select line CSL corresponding to an addressed column. Then, according to a row address included in the DRAM address, a word line corresponding to an addressed row is driven to a selected state. Thus the write data (WD) from global IO line GIO is transferred to and written in a selected memory cell. When a clock cycle period required for writing the data (two clock cycles in FIG. 21) elapses, transfer instruction signal φbe is inactivated and global IO line GIO returns to a high impedance state (or a state precharged at a predetermined potential level). Column select line CSL and the word line are also each driven to a non-selected state.

Figure 21:
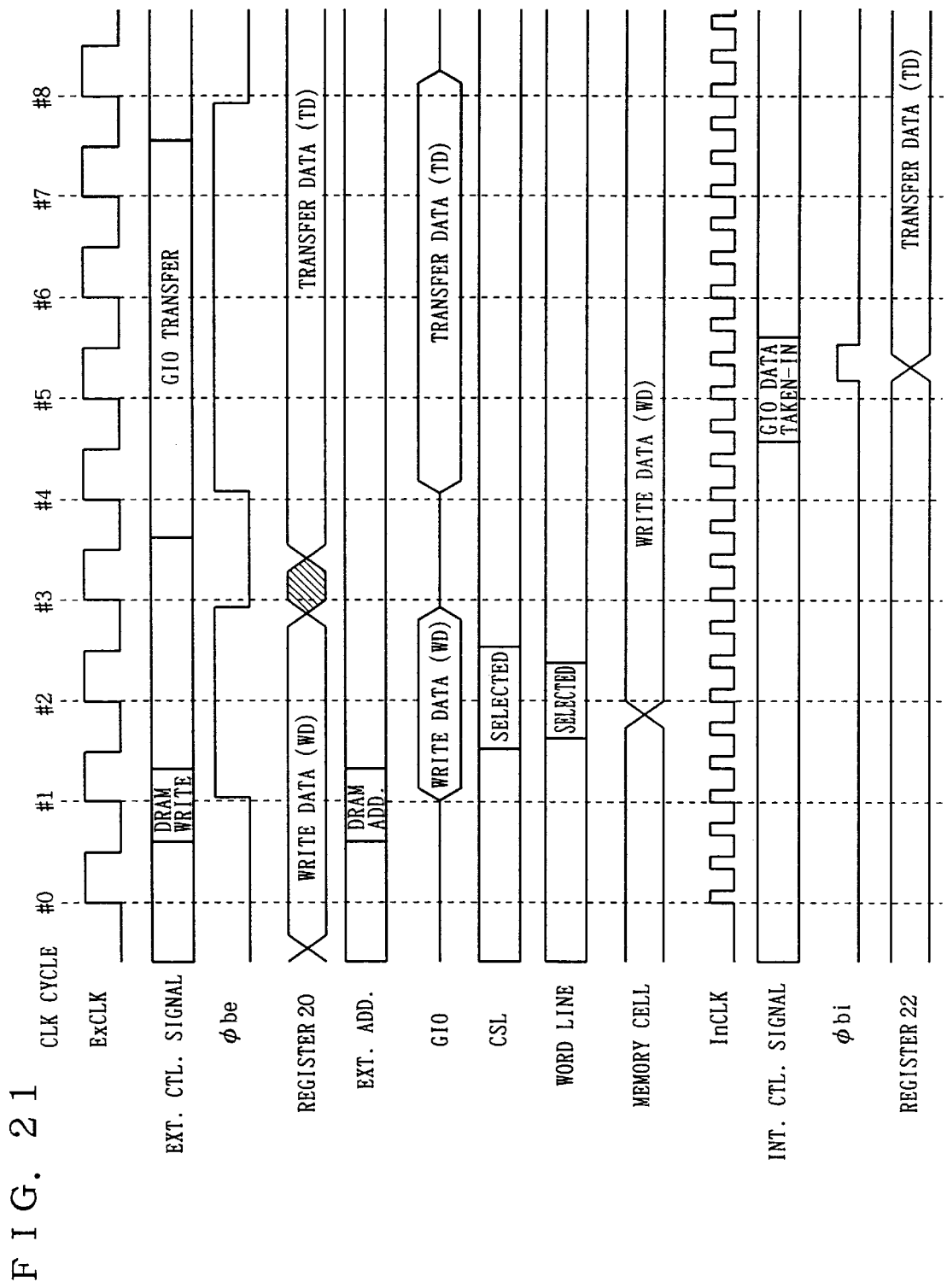
FIG. 21 is a waveform diagram representing an operation of the memory integrated circuit device shown in FIG. 20.

It should be noted that in the data write operation represented in FIG. 21, a DRAM address has a row address and a column address applied simultaneously and represented as a non-multiplexed address, and a column select signal CSL can be activated at an earlier timing than a word line. In the row and column select sequence, a word line may be driven to an active state at an earlier timing than a column select line CSL, as in standard DRAMs. A DRAM address may be applied with the row and column addresses multiplexed. In this example, as the external control signal, an active command which places the DRAM in an active state and a write/read command instruction writing/reading data are applied separately. When an active command is applied, a row address signal is taken in and a row select operation is performed in the DRAM memory cell array. When a read/write command is applied, a column address is taken in to perform a column select operation and write or read data, as is similar to the operation sequence of conventional clock synchronous DRAMs.

Since the data stored in register 20 are collectively written into selected memory cells via global IO lines GIO0 to GIOn, a large amount of data can be collectively written even with the external data bus having a narrow bit width (i.e. even for external data having a small number of bits), to rapidly write the data. The external data is written into the register circuits of register 20 successively.

The data transfer operation between registers will now be described. In the data transfer between registers also, the operation sequence when data transfer between registers is instructed with data to be transferred (TD) stored in register 20 is presented. An external control signal is set in a GIO transfer instructing state instructing data transfer between registers. In clock cycle #4, external interface 60 takes in and applies the external control signal to external controller 62 in synchronization with a low to high transition of external clock signal ExCLK. According to the GIO transfer instruction based on the external control signal, external controller 62 activates transfer instruction signal φbe for register 20 when column decode enable signal CDE from DRAM control 64 is in an inactive state. Thus, the data to be transferred (TD) from register 20 is transferred on global IO lines GIO0 to GIOn. After external controller 62 transmits the activated transfer instruction signal φbe to register 20, external controller 62 applies to internal controller 72 at a predetermined timing a signal RT indicating that data transfer between registers have been prepared.

Internal controller 72 is notified that data is to be transferred between registers and to be loaded into internal circuit 66 in response to an internal control signal from internal circuit 66 (i.e. a load/store transfer instructing signal has been output). Internal controller 72 activates transfer instruction signal φbi for register 22 for a predetermined period, according to the GIO data reception indication of the internal control signal and to indication RT from external controller 62 that the preparation for data transfer is completed. In response to the activated transfer instruction signal φbi, register 22 takes in and latches the transfer data (TD) transmitted on global IO lines GIO0 to GIOn. Then, according to a load request from internal circuit 66, transfer instruction signal φai is activated under the control of internal controller 72, and the transfer data (TD) stored in register 22 is transferred to internal circuit 66 via internal data bus 71 and internal interface 70.

Data transfer from register 22 to register 20 can be performed similarly. In this case, internal controller 72 activates the load/store transfer instructing signal to notify the external controller that data is to be transferred. Responsively, an externally provided controller generates a transfer instruction signal required for storing the data transferred from register 22 into register 20 and applies the transfer instruction signal to external interface 60. According to the transfer instruction of the external control signal, external controller 62 activates connection instruction signal φbe to control the connection of register 22 to global IO lines GIO0 to GIOn. In this case also, external controller 62 controls register 20, according to indication RT from internal controller 72 of completion of preparation for data transfer indicating that the preparation for data transfer is completed.

Figure 22:
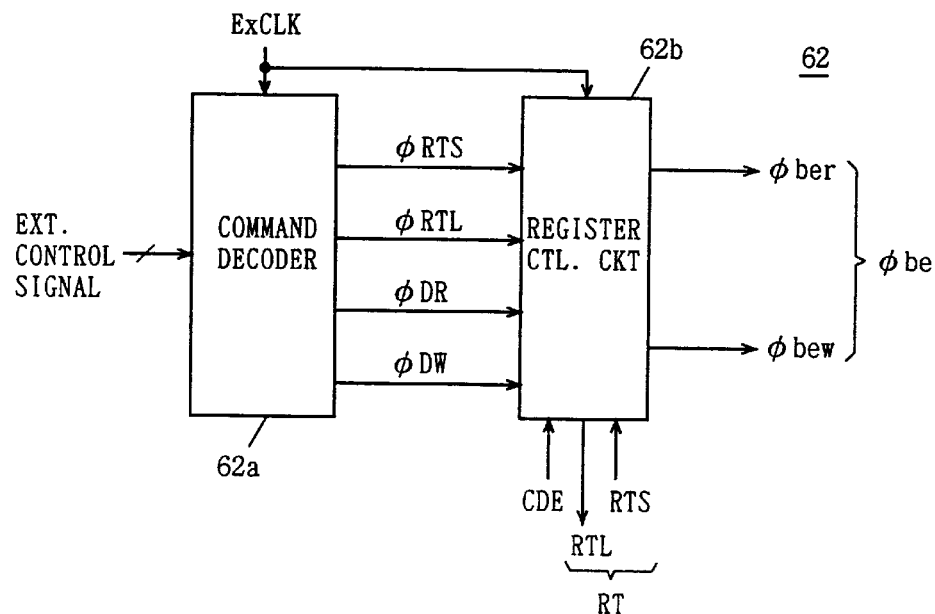
FIG. 22 schematically shows a configuration of the external controller shown in FIG. 20.

FIG. 22 schematically shows an entire configuration of external controller 62 shown in FIG. 20. In FIG. 22, external controller 62 includes: a command decoder 62a for decoding an external control signal provided from external interface 60 in response to external clock signal ExCLK to generate a signal designating an operation mode specified according the result of decoding; and a register control circuit 62b responsive to an operation mode designating signal from command decoder 62a for producing a connection control signal (a transfer instruction signal) for register 20. FIG. 22 only shows control signals for controlling the connection between register 20 and global IO lines GIO0 to GIOn and operation mode designation signals.

Command decoder 62a responds to external clock signal ExCLK to determine an operation mode specified according to a combination of the states of a plurality of external control signals. Since an operation mode is designated by a combination of the states of a plurality of external control signals, it is not necessary to prepare an external control signal for each operation mode and the number of external control signals can thus be reduced.

A store transfer instructing signal φRTS is activated when data transfer from register 20 to register 22 is designated. A load transfer instructing signal φRTL is activated when data transfer from register 22 to register 20 is designated. A DRAM read instructing signal φDR is activated when reading the data from a memory cell of the DRAM array is designated. A DRAM write instructing signal φDW is activated when writing data into DRAM memory cell array 1 is designated.

Register control circuit 62b activates transfer instruction signals fiber and φbew in response to controls signals φRTS, φRTL, φTR and φDW and to column decode enable signal CDE from DRAM control 64 shown in FIG. 20 and signal RTS from internal controller 72 indicating that the preparation for transfer is completed. Register 20 is assumed to have the configuration shown in FIG. 10 or 12 and register 20 has data written via a path and read via another path. Transfer instruction signal φber activates the data transfer from global IO lines GIO0 to GIOn to register 20. Signal φbew activates the data transfer from register 20 to global IO lines GIO0 to GIOn. Register control circuit 62b also responds to activation of transfer instruction signal φbew to apply to internal controller 72 a signal RTL indicating that the preparation for transfer is completed.

Figure 23:
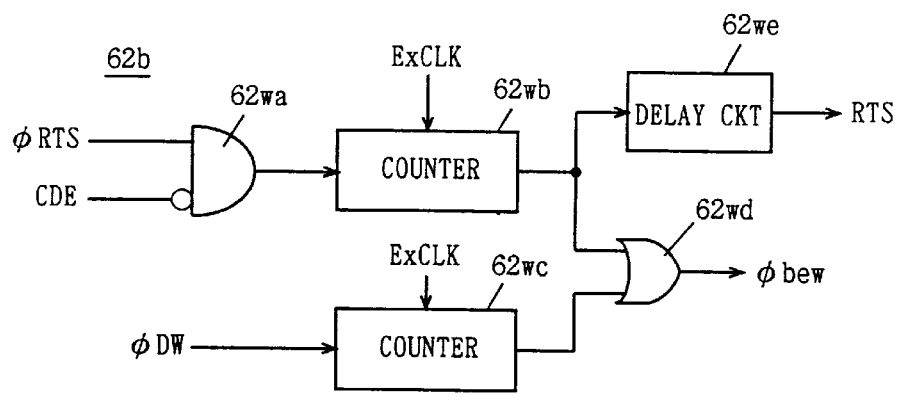
FIG. 23 schematically shows a configuration of a data write control signal generating portion of the register control circuit shown in FIG. 22.

FIG. 23 schematically shows an exemplary configuration of a transfer instructing signal φbew generating portion of register control circuit 62b. In FIG. 23, the write transfer instructing signal φbew generating portion includes: a gate circuit 62wa receiving store transfer mode instruction signal φRTS and column decode enable signal CDE; a counter 62wb initiated in response to activation of an output signal of gate circuit 62wa to count external clock signal ExCLK to output an activated signal for a predetermined clock cycle period; a counter 62wc initiated in response to activation of DRAM write mode instruction signal φDW to count external clock signal ExCLK to output an activated signal for a predetermined period; a gate circuit 62wd receiving output signals from counters 62wb and 62wc; and a delay circuit 62we for delaying the output signal of counter 62wb for a predetermined time.

Counter 62wc is initiated in writing data to the DRAM array and outputs an activated signal for the period required for writing the data into the DRAM. Counter 62wb outputs an activated signal for the period required for the operation of transferring data from register 20 to register 22.

Gate circuit 62wa outputs an activated signal when store transfer mode instructing signal φRTS is in an active state and column decode enable signal CDE is in an inactive state. Gate circuit 62wd puts write transfer instruction signal φbew in an active state while the output signal of one of counters 62wb and 62wc is in an active state. Signal RTS from delay circuit 62we that indicates that the preparation for data transfer is completed is put in an active state after write transfer instructing signal φbew is put in an active state. Delay circuit 62ew may be a circuit which delays only activation of the output signal from counter 62wb by a predetermined period, or a delay one-shot pulse generating circuit responsive to activation of the output signal from counter 62wb for generating a one-shot pulse signal having a predetermined time width when a predetermined time elapses.

In the configuration shown in FIG. 23, when the data transfer from register 20 to register 22 is designated, counter 62wd is activated under the condition that column decode enable signal CDE is in an inactive state, and write transfer instructing signal φbew from gate circuit 62wd is activated for a predetermined period. Thus, the write data stored in register 20 is transferred on global IO lines GIO0 to GIOn. In writing data to the DRAM memory cell array, DRAM write mode instructing signal φdw is activated and the output signal of counter 62wc is activated. Also, write transfer instructing signal φbew is activated conforming to the timing at which the data is written into the DRAM.

Delay circuit 62we activates its output signal RTS after a store transfer instruction is received and the transfer data from register 20 is transmitted on global IO lines GIO0 to GIOn. Register 22 can accurately incorporates the transfer data on global IO lines GIO0 to GIOn.

Figure 24:
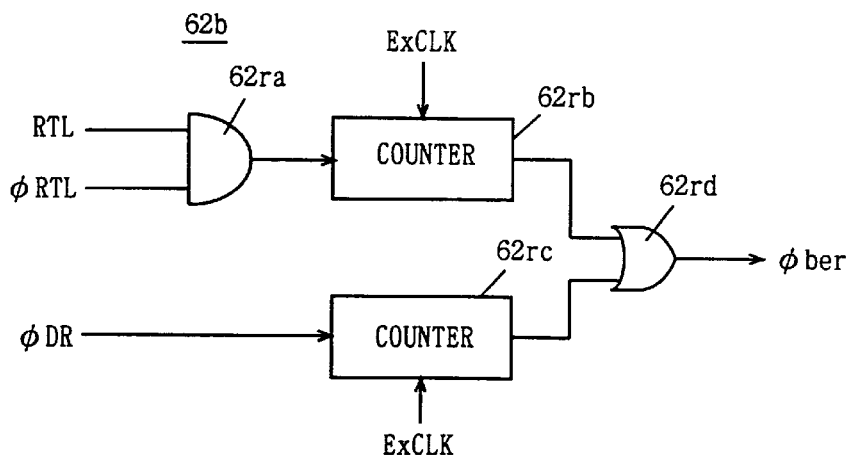
FIG. 24 schematically shows a configuration of a signal generating portion for reading data, of the register control circuit shown in FIG. 22.

FIG. 24 shows an exemplary configuration of a read transfer instructing signal φber generating portion of register control circuit 62b shown in FIG. 22. In FIG. 24, the read transfer instructing signal generating portion includes: a gate circuit 62ra which receives signal RTL indicating that the preparation for transfer is completed and the load transfer mode instructing signal φRTL; a counter 62rb initiated in response to activation of an output signal of gate circuit 62ra to count external clock signal ExCLK to output an activated signal for a predetermined period; a counter 62rc initiated in response to activation of DRAM read mode instructing signal φDR to count external clock signal ExCLK to output an activated signal for a predetermined period; and a gate circuit 62rd receiving output signals of counters 62rb and 62rc.

Gate circuit 62rd outputs read transfer instructing signal φber. Column decode enable signal CDE is not applied to the read transfer instructing signal generating portion, since signal RTL indicating that the preparation for data transfer is completed is activated under the condition that column decode enable signal CDE is inactive.

For the configuration shown in FIG. 24, when transfer data is prepared in register 22 and a load transfer instructing signal (command) is applied from the external, the output signal of gate circuit 62ra is activated. In response to the activation of the output signal of gate circuit 62ra, counter 62rb is initiated to count external clock signal ExCLK and activates its output signal for a period required for reading the transferred data.

In reading data from the DRAM memory cell array, DRAM read mode instructing signal φDR is activated. Counter 62rc activates its output signal for a period required for reading data from the DRAM memory cell array. Gate circuit 62rd activates read transfer instructing signal φber for a period required for each of operation modes of transferring data between registers and of reading data from a DRAM memory cell.

It should be noted that for the configuration of the register control circuit shown in FIGS. 23 and 24, counters which count external clock signal ExCLK are used to determine the respective periods for which transfer instruction signals φbew and φber are activated. However, the timings of activation of the control signals may be determined according to an external control signal. In particular, if DRAM write mode instructing signal φdw and DRAM read mode instructing signal φDR are adapted to be inactivated according to an externally applied precharge command which shifts the DRAM to a precharged state, the counters responsive to signals φDW and φDR are not particularly required and the timing for shifting to an active state has only be set depending on each operation mode.

Furthermore, internal controller 72 is similar in configuration to external controller 62 shown in FIGS. 22 to 24 and receives an internal control signal in place of an external control signal. Internal controller 72 also receives signal RTS indicating that the preparation of data transfer is completed, and outputs signal RTL indicative of completion of the preparation. Thus, the configuration is identical to that shown in FIGS. 22 to 24 and the configuration of internal controller 72 is not shown.

Figure 25:
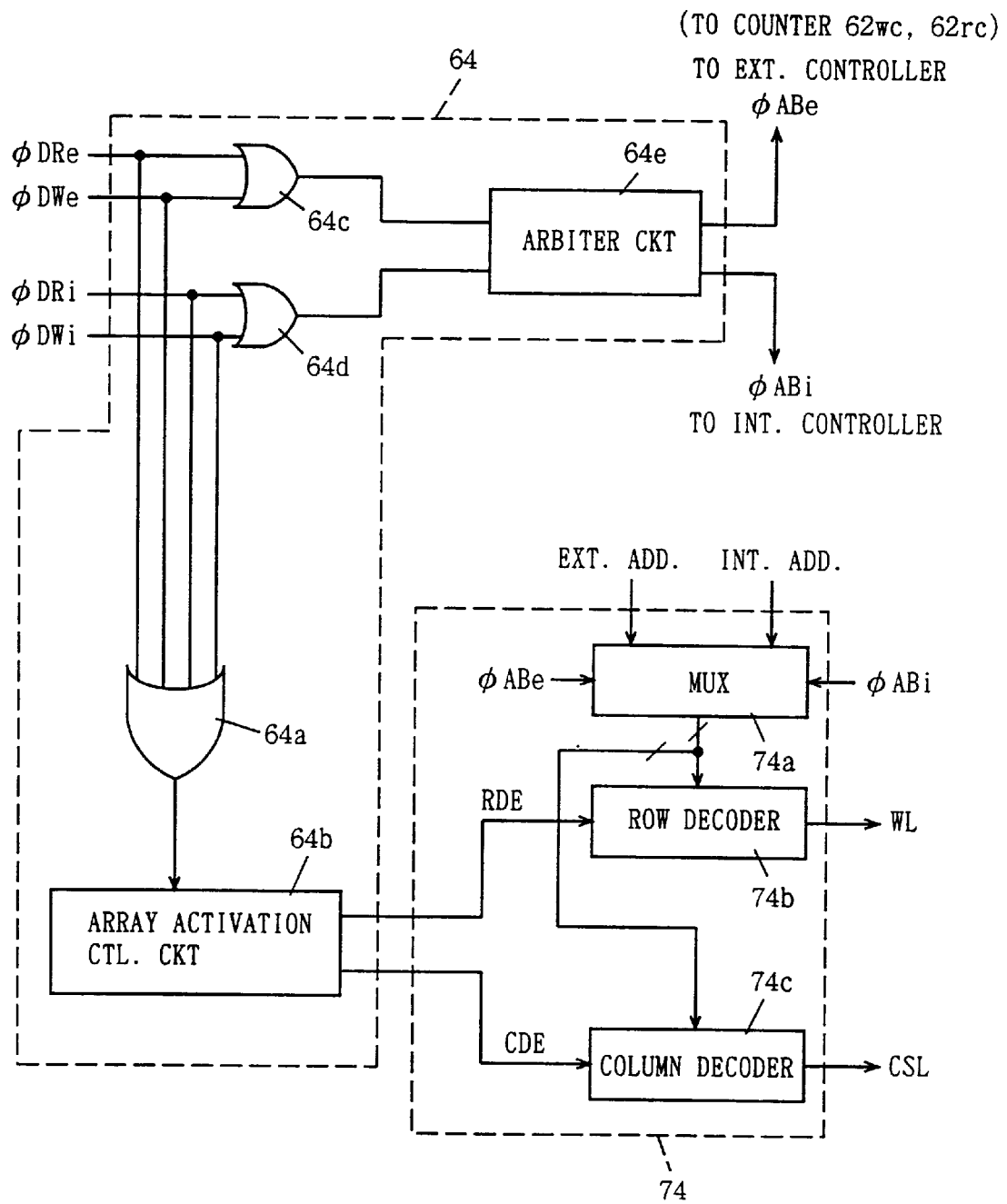
FIG. 25 schematically shows respective configurations of the DRAM control and DRAM driver shown in FIG. 20.

FIG. 25 schematically shows the configurations of DRAM control 64 and DRAM driver 74 shown in FIG. 20. In FIG. 25, DRAM control 64 includes: a gate circuit 64a which receives a DRAM read mode instructing signal φDRe and a DRAM write mode instructing signal φDWe applied from the external controller and a DRAM read mode instructing signal φDRi and a DRAM write mode instructing signal φDWi applied from internal controller 72; and an array activation control circuit responsive 64b responsive to activation of a signal of gate circuit 64a to successively activate control signals required for activating the DRAM memory cell array.

In FIG. 25, row decode enable signal RDE instructing initiation of a row select operation in the DRAM array and column decode enable signal CDE instructing initiation of a column select operation in the DRAM array are representatively shown being output from array activation control circuit 64b. Data input/output to/from DRAM memory cell array 1 is performed via registers 20 and 22 rather than an input/output buffer as in standard DRAMs. In the present embodiment, data is read or written from or to the DRAM array in the same internal row and column select operation sequences and the control signals from array activation control circuit 64b are generated according to the respective predetermined sequences for the row and column selection. Gate circuit 64a drives its output signal to an active state when any of mode instruction signals φDRe, φDWe, φDRi and φDWi is activated.

If the row and column select sequences differ between data reading and data writing, array activation control circuit 64b has only to receive the output signals from separate gates, one gate receiving write mode instructing signals φCDWe and φDWi and another gate receiving read mode instructing signals φDRe and φDRi.

If a DRAM is accessed by applying time-division multiplexed row and column addresses and also applying an active command in applying the row address and a read/write command in applying the column address, the row select operation is performed according to an output signal of the gate receiving the active command and the column select operation is performed according to an output of the gate circuit receiving the read/write command. An appropriate configuration may be employed depending on the sequence in which commands are applied to the memory integrated circuit device. FIG. 25 shows a representative configuration.

DRAM control 64 also includes: a gate circuit 64c receiving mode instruction signals φDRe and φDWe from the external controller; a gate circuit 64d receiving mode instruction signals φDRi and φDWi from the internal controller; and an arbiter circuit 64e responsive to the output signals of gate circuits 64c and 64d for preventing access conflict according to a predetermined priority order.

Arbiter circuit 64e outputs an arbitration result signal φABe applied to the external controller and an arbitration result signal φABi applied to the internal controller. Arbitration result signals φABe and φABi are inactivated when an access is prohibited. Arbitration result signals φABe and φABi are applied, for example, to counters 62wc and 62rc shown in FIGS. 23 and 24 to prohibit access to the DRAM (i.e. to prohibit data transfer between the registers and the global IO lines). Gate circuit 64c drives its output signal to an active state when one of operation mode instructing signals φDWe and φDRe is activated. Gate circuit 64d drives its output signal to an active state when one of the signals φDWi and φDRi is activated.

When only one of the output signals of gate circuits 64c and 64d is activated, arbiter circuit 64e permits an access to the activated port (i.e. the external controller or the internal controller) by activating arbitration result signal φABe or φABi for the port permitted of accessing. When the output signals of gate circuits 64c and 64d are both activated, arbitration is made according to the predetermined priority order. The arbitration may be provided to allow the precedently accessing port to access the DRAM, or may be provided to allow a predetermined one port to always access the DRAM.

DRAM driver 74 includes: a multiplexer 74a receiving external and internal address signals and selectively passing one of them according to arbitration result signals φABe and φABi from arbiter circuit 64e; a row decoder 74b activated in response to activation of row decode enable signal RDe from the array activation control circuit 64b to decode a row address signal applied via multiplexer 74a to drive the word line WL corresponding to an addressed row to a selected state; and a column decoder 74c activated in response activation column decode enable signal CDE from the array activation control circuit 64b to decode a column address applied from multiplexer 74a to drive the column select line CSL corresponding to an addressed column to a selected state.

Provision of multiplexer 74a ensures that a memory cell is selected according to an address signal from a port (the external controller or the internal controller) permitted to access the DRAM.

Instead of the configuration shown in FIG. 20, external and internal controllers 62 and 72 may received external and internal address signals from external and internal interfaces 60 and 70, respectively. In this configuration, arbitration result signals φABe and φABi from arbiter circuit 64e determines permission/prohibition for address output of internal and external controllers 62 and 72. The prohibited address output is put in a high impedance state. Thus, even if the same address bus is used to apply address signals from internal controller 72 and external controller 62 to row decoder 74b and column decoder 74c, the address output in an access prohibition state is in a high impedance state and a memory cell can be accurately selected according to an address permitted of access.

Figure 26:
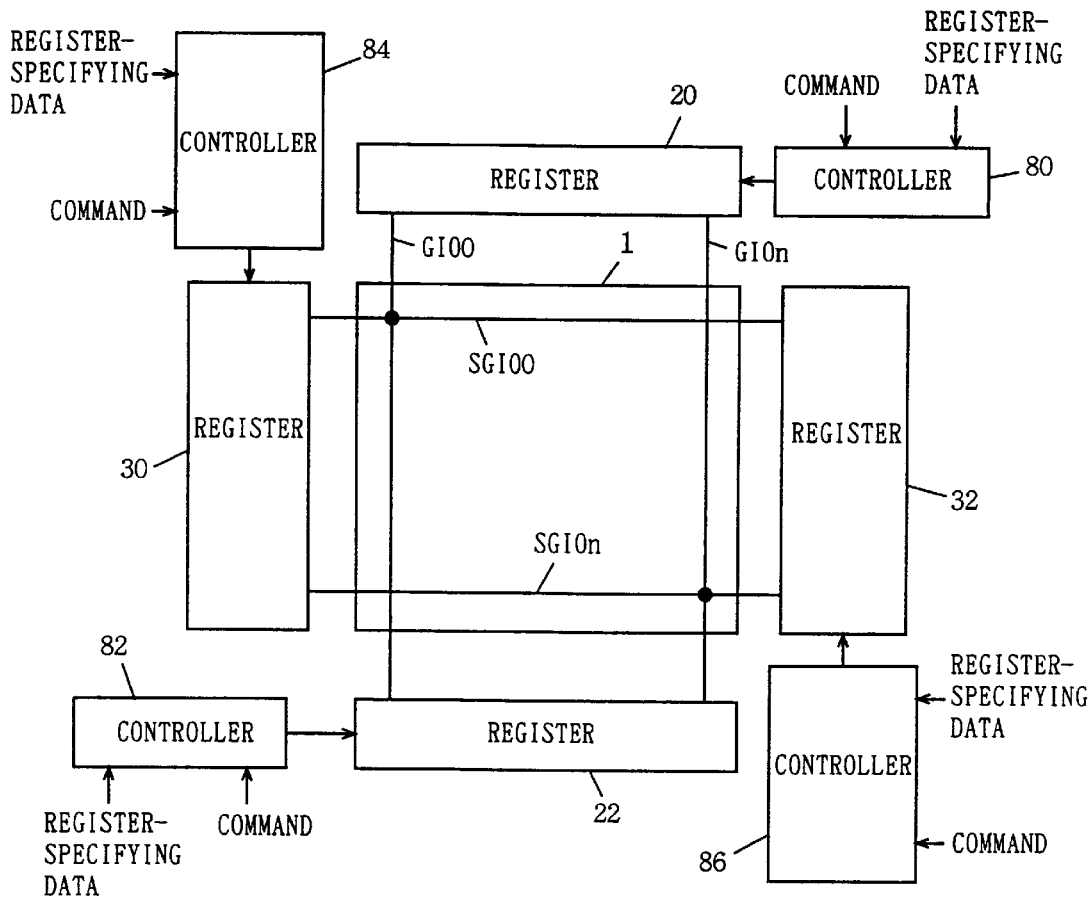
FIG. 26 schematically shows the configuration of a modification of the third embodiment of the present invention.

As shown in. FIG. 26, for registers 20, 22, 30 and 32 arranged along the four sides of DRAM memory cell array 1 controllers 80, 82, 84 and 86 are provided, respectively. Controllers 80, 82, 84 and 86 each receive an operation-mode designating command, and register-specifying data. The register-specifying data includes a data indicating that the associated controller is selected, and a destination register specifying data. In data transfer between registers also, registers 20, 22, 30 and 32 are independently controlled by the associated controllers 80, 82, 84 and 86. Controllers 80, 82, 84 and 86 can connect the associated registers 20, 22, 30 and 32 to global IO lines or subglobal IO lines according to an applied command to simultaneously transfer data from one register to a plurality of registers.

It should be noted that in the configuration shown in FIG. 26, the register-specifying data is used to notify destination register that transfer is completely prepared for. Controllers 80, 82, 84 and 86 are activated when each command is set from a standby state to a specific state. If two registers 20 and 22 are coupled with the external data bus and registers 22 and 32 are coupled with the internal data bus, as shown in FIG. 14, operations other than the data transfer between registers also require the register-specifying data.

Figure 27:
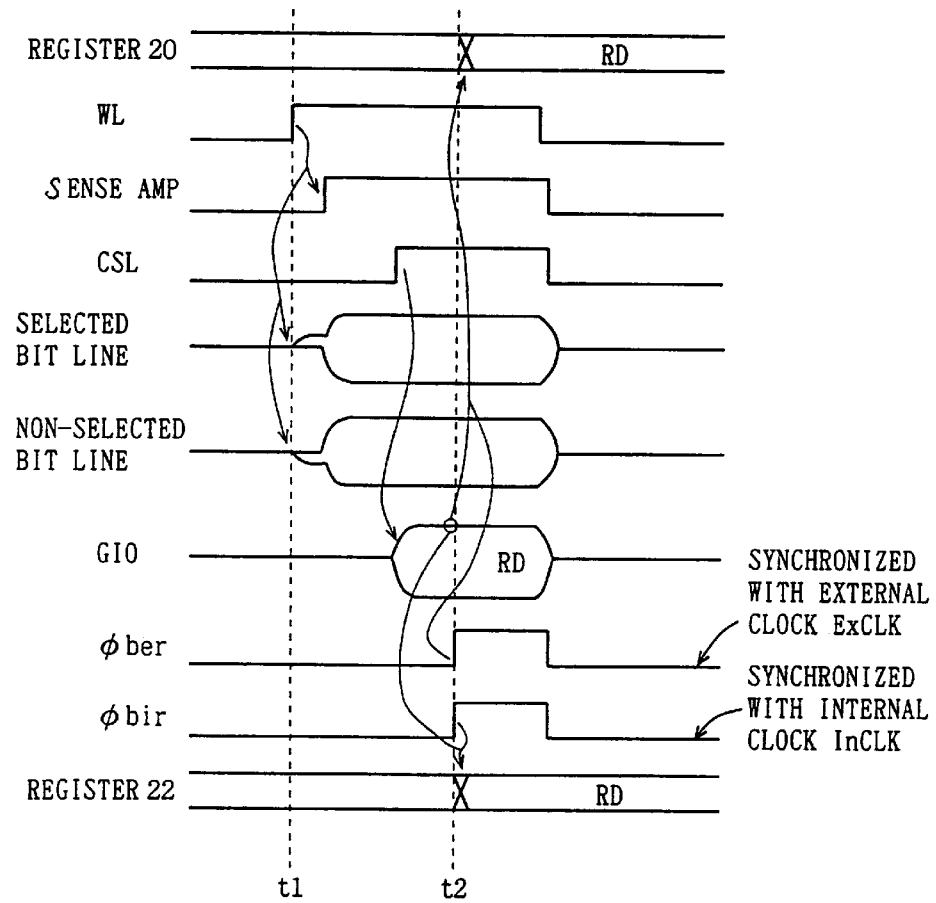
FIG. 27 is a waveform diagram representing a data transfer operation according to the third embodiment of the present invention.

FIG. 27 represents another modification of the sequence for reading data from the DRAM. In FIG. 27, the data read from the DRAM memory cell array is transferred to and stored in latches 20 and 22 simultaneously.

More specifically, at time t1, a word line WL in the DRAM memory cell array is driven to a selected state, a sense amplifier is then activated, and a selected bit line and a non-selected bit line which is connected to the selected word line WL but is not subjected to data transfer have their potentials varied and latched according to the corresponding memory cell data. When column select line CSL is driven to a selected state, the data latched by the sense amplifier for the selected bit line is transmitted onto global IO data bus GIO and the potential on global IO data bus GIO changes to the potential level corresponding to the selected memory cell data RD.

At time t2, read transfer instructing signals φber and φbir are generated (i.e. activated) from external controller 62 and internal controller 72 (shown in FIG. 20). In response to the activated read transfer instructing signals φber and φbir, the data reading portions of latches 20 and 22 are activated and the read data RD on global IO data GIO is stored in each of latches 20 and 22.

Read transfer instructing signal φber applied from the external controller is a signal synchronized with external clock ExCLK, whereas read transfer instructing signal φbir applied from the internal controller is a signal synchronized with internal clock InCLK. Thus, signals φber and φbir are not required to be activated at the same time, t2. Signals φber and φbir are also not required to be activated for the same period of time. The internal controller and the external controller can be independently controlled by external control signal and internal control signal, respectively. Thus, the configuration shown in FIGS. 22 to 24 can be used to implement the operation of transferring the data read from the DRAM memory cell array shown in FIG. 27 to registers 20 and 22 simultaneously.

When a DRAM read command is applied to the external and internal controllers simultaneously, the arbitration operation by DRAM control 64 shown in FIG. 25 causes only one controller to be placed in an operable state. Accordingly, simultaneous activation of transfer instruction signals φber and φbir as shown in FIG. 27 requires an arbiter circuit as described later. In this case, however, one register has only to be adapted to perform an operation of reading the data on global IO data bus GIO simply according to another command prepared for reading the data on the global IO lines thereto, whereas the other register has only to be adapted to perform a DRAM read operation to perform the operation of reading the data read from the DRAM memory cell array thereinto. In this configuration, while the number of commands to be prepared is increased, particular changes are not required to the configuration of the external and internal controllers.

Modification of Arbiter Circuit

Figure 28:
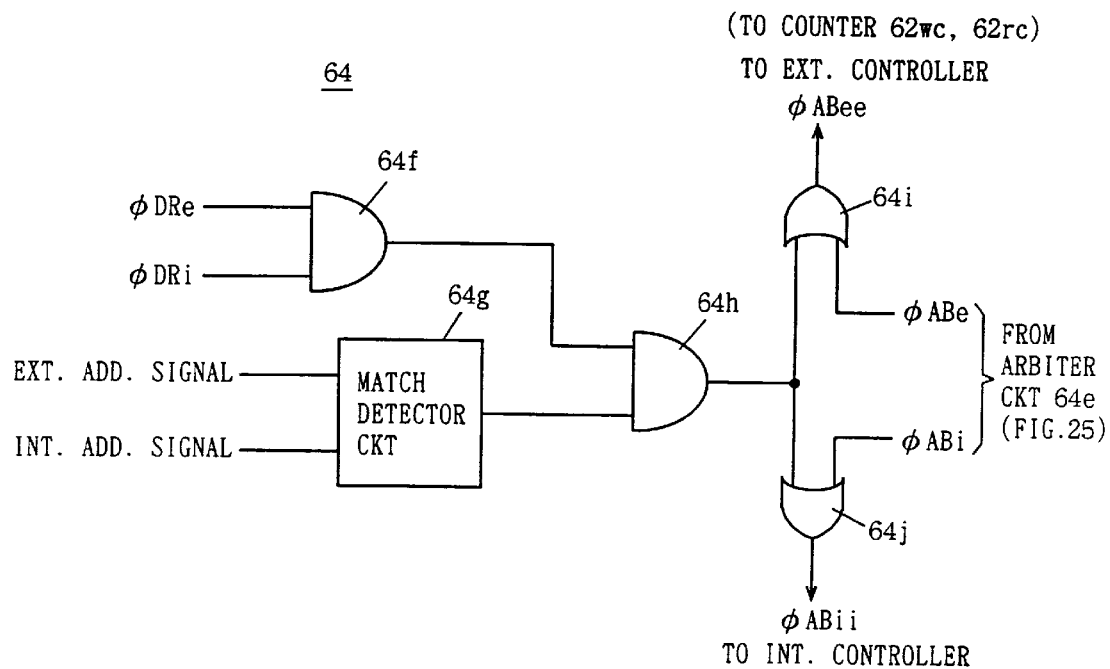
FIG. 28 schematically shows a configuration of the DRAM control according to the fourth embodiment of the present invention.

FIG. 28 shows the configuration of a modification of DRAM control 64 shown in FIG. 25. FIG. 28 shows the configuration of only the portion implementing the arbitration operation. The array activation control circuit which activates the DRAM memory cell array is also included in DRAM control 64.

In FIG. 28, DRAM control 64 includes the configuration shown in FIG. 25 and in addition a gate circuit 64f receiving DRAM read mode instructing signals φDRe and φDRi, a match detector 64g for detecting matching of external and internal address signals, a gate circuit 64h receiving an output signal from gate circuit 64f and an output signal of match detector circuit 64g, a gate circuit 64i receiving an output signal of gate circuit 64h and arbitration result signal φABe from arbiter circuit 64e shown in FIG. 25, and a gate circuit 64j receiving the output signal of gate circuit 64h and arbitration result signal φABi.

An arbitration result indicating signal φABee from gate circuit 64i is applied to the external controller, and an arbitration result indicating signal φABii from gate circuit 64j is applied to the internal controller. When arbitration result indicating signals φABee and φABii are inactivated, they each attain a low level to prohibit the operation of the associated controller.

Gate circuit 64f outputs an activated signal (high-level signal) when DRAM read mode instructing signals φDRe and φDRi are both activated. Match detector 64g outputs an active high level) signal when an external address signal and an internal address signal designate a same address. Gate circuit 64h outputs an active (high level) signal when the output signal of gate circuit 64f and the output signal of match detector 64g are both activated. Gate circuit 64i activates arbitration result indicating signal φABee regardless of the state of arbitration result signal φABe when the output signal of gate circuit 64h is in an active state. Similarly, gate circuit 64g also activates arbitration result indicating signal φABii regardless of the state of arbitration result signal φABi when the output signal of gate circuit 64h is in an active state.

If the external and internal circuits both read the data of a memory cell located at the same address of the DRAM memory cell array, the arbitration operation of the DRAM control shown in FIG. 28 activates the output signal of gate circuit 64h and therefore arbitration result indicating signals φABee and φABii and thus the external and internal controllers are both rendered operable. Thus, registers 20 and 22 shown in FIG. 20 are connected to global IO lines GIO0 to GIOn to read in the memory cell data transferred on global IO lines GIO0 to GIOn and store the data.

The DRAM driver (shown in FIG. 20) selects one of external and internal address signals depending on the arbitration result from arbiter circuit 64e, as shown in FIG. 25, to perform a memory cell select operation. The external and internal address signals designate a same address and either address can thus be used without causing any problems.

As shown in FIG. 28, when an external device and an internal circuit simultaneously request the reading of data located at the same address in the DRAM memory cell array, permission of reading the data into registers 20 and 22 allows the data to be transmitted from the DRAM memory cell array to registers 20 and 22 in one operation to provide an improved data transfer efficiency (since the wait time of the external device or the internal circuit can be eliminated).

Fifth Embodiment

Figure 29:
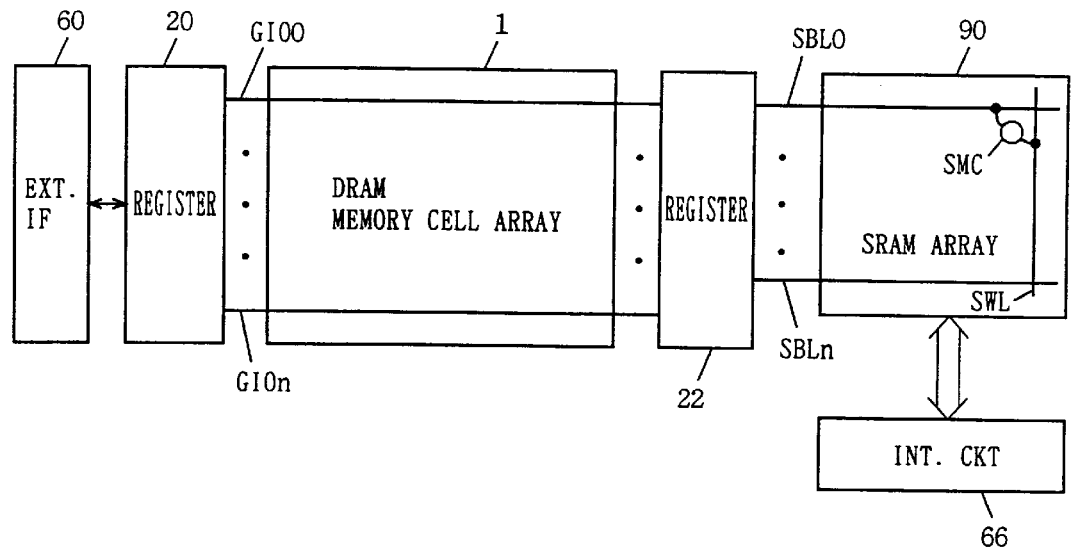
FIG. 29 schematically shows the entire configuration of a memory integrated circuit device according to a fifth embodiment of the present invention.

FIG. 29 schematically shows the entire configuration of a memory integrated circuit device according to a fifth embodiment of the present invention. For the memory integrated circuit device shown in FIG. 29, an SRAM array 90 is arranged opposite to DRAM memory cell array 1 with respect to register 22. Respective register circuits of register 22 are coupled with SRAM bit lines SBL0 to SBLn of the internal data lines in the SRAM array. In FIG. 29, an SRAM memory cell SMC arranged at the intersection of one word line SWL and SRAM bit line SBL0 is representatively shown. Internal circuit 66 accesses SRAM array 90. Register 20 is provided with external interface 60 for data communication with the external to the device. External interface 60 has a bus-width conversion function to input and output data depending on the bus width of the external data bus.

An SRAM is a memory higher in speed than a DRAM. Data are collectively transferred between DRAM memory cell array 1 and SRAM array 90 via register 22 and the required data is stored in SRAM array 90. Accessing of internal circuit 66 SRAM array 90 allows the required data to be rapidly accessed and processed.

By employing SRAM array 90 as a so-called "cache", a memory integrated circuit device capable of rapid processing can be provided. Connection of SRAM bit lines SBL0 to SBLn as the internal data bus lines within SRAM array 90 to register 22 allows collective transfer of the corresponding data from SRAM array 90 to register 22 and therefore efficient data transfer. Furthermore, it is not necessary to provide a dedicated internal data bus between register 22 and SRAM array 90, resulting in reduction of the area occupied by interconnection lines.

First Modification

Figure 30:
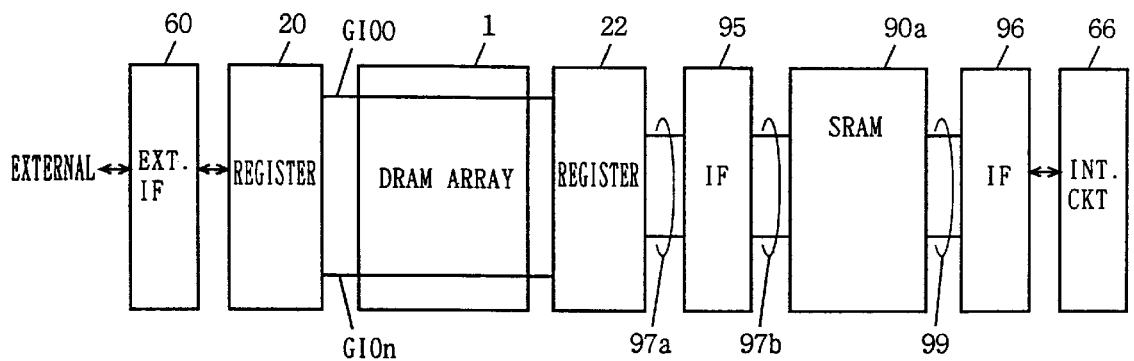
FIG. 30 schematically shows the configuration of a modification of the memory integrated circuit device according to the fifth embodiment of the present invention.

FIG. 30 schematically shows the configuration of a first modification of the fifth embodiment according to the present invention. In FIG. 30, register 22 for an internal circuit is coupled with an SRAM 90a via an interface 95. An internal data bus 97a is provided between interface 95 and register 22, and an internal data bus 97b is provided between interface 95 and SRAM 90a. Interface 95 is provided with a function of converting a bus with depending on the data bus width (the number of data bits) of SRAM 90a. If the data bit width of SRAM 90a is the same as the number of data bits stored in register 22 (the number of global IO lines GIO0 to GIOn of the DRAM array), interface 95 simply controls writing/reading data to/from SRAM 90a in data transfer and is not particularly required of the bus-width changing function.

SRAM 90a is also coupled with internal circuit 66 via an interface 96 accessing SRAM 90a according to an access request from internal circuit 66. Interface 96 is coupled with SRAM 90a via an internal data bus 99. Interface 96 may have a data bus width converting function. Internal data buses 97b and 99 may be SRAM bit lines within the SRAM array of SRAM 90a.

In the configuration shown in FIG. 30 also, internal circuit 66 can access SRAM 90a. Thus, the data required can be read from SRAM 90a as a high-speed memory by accessing it, to achieve fast data processing. Also, the processed data can be stored in SRAM 90a to rapidly store results of data processings. Thus, a memory integrated circuit device with rapid processing function can be provided. Register 20 provided for an external circuit to DRAM array 1 is coupled via external interface 60, which configuration is the same as that shown in FIG. 29.

Second Modification

Figure 31:
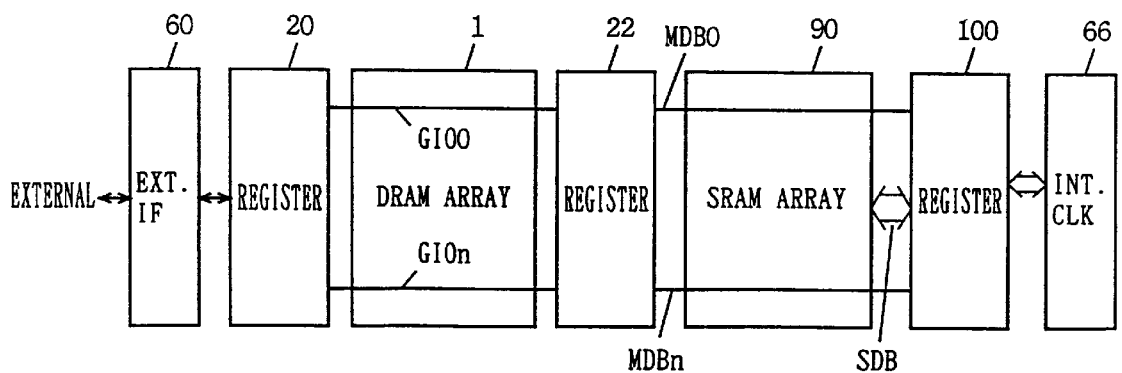
FIG. 31 schematically shows the configuration of a modification of the memory integrated circuit device according to the fifth embodiment of the present invention.

FIG. 31 schematically shows the configuration of a second modification of the fifth embodiment of the invention.

The memory integrated circuit device shown in FIG. 31 includes SRAM array 90, as is similar to the configuration shown in FIG. 29. Memory data bus lines MBD0 to MDBn are provided over SRAM array 90 and connected to a register 100 arranged opposite to register 22 with respect to SRAM array 90. Register 100 can perform collective data transfer to and from SRAM array 90 via SRAM data bus SDB. Internal circuit 66 selectively accesses register 100 by the number of bits corresponding to the data bus width of the internal circuit. In this example, internal circuit 66 has a function of successively selecting the ports of register 100 that are coupled with internal circuit 66.

Since memory data bus MDB (MDB0 to MDBn) between registers 22 and 100 is provided over SRAM array 90, the interconnection area between registers 22 and 100 are not particularly required. Registers 22 and 100 can simply be connected together by linear memory data bus lines MDB0 to MDBn to allow data transfer at the minimum distance.

The data transfer between register 100 and SRAM array 90 via SRAM data bus SDB allows fast data transfer. SRAM data bus SDB may be connected to respective SRAM bit lines of the SRAM array. Since memory data bus lines MDB0 to MDBn are formed in an interconnection layer above SRAM bit lines, data can be transferred between SRAM array 90 and register 100 without causing any problems.

In the configuration shown in FIG. 31, internal circuit 66 successively accesses the data stored in register 100. Since a prefetch memory is provided within internal circuit 66 successive storage of data into the prefetch memory allows internal circuit 66 to rapidly perform the required data processings. Furthermore, since memory data bus lines MDB0 to MDBn overlying the SRAM array are provided over and across SRAM array 90, the data transfer between the SRAM array and register 100 can be performed in parallel with the data transfer between register 22 and register 100.

Chip Layout

Figure 32:
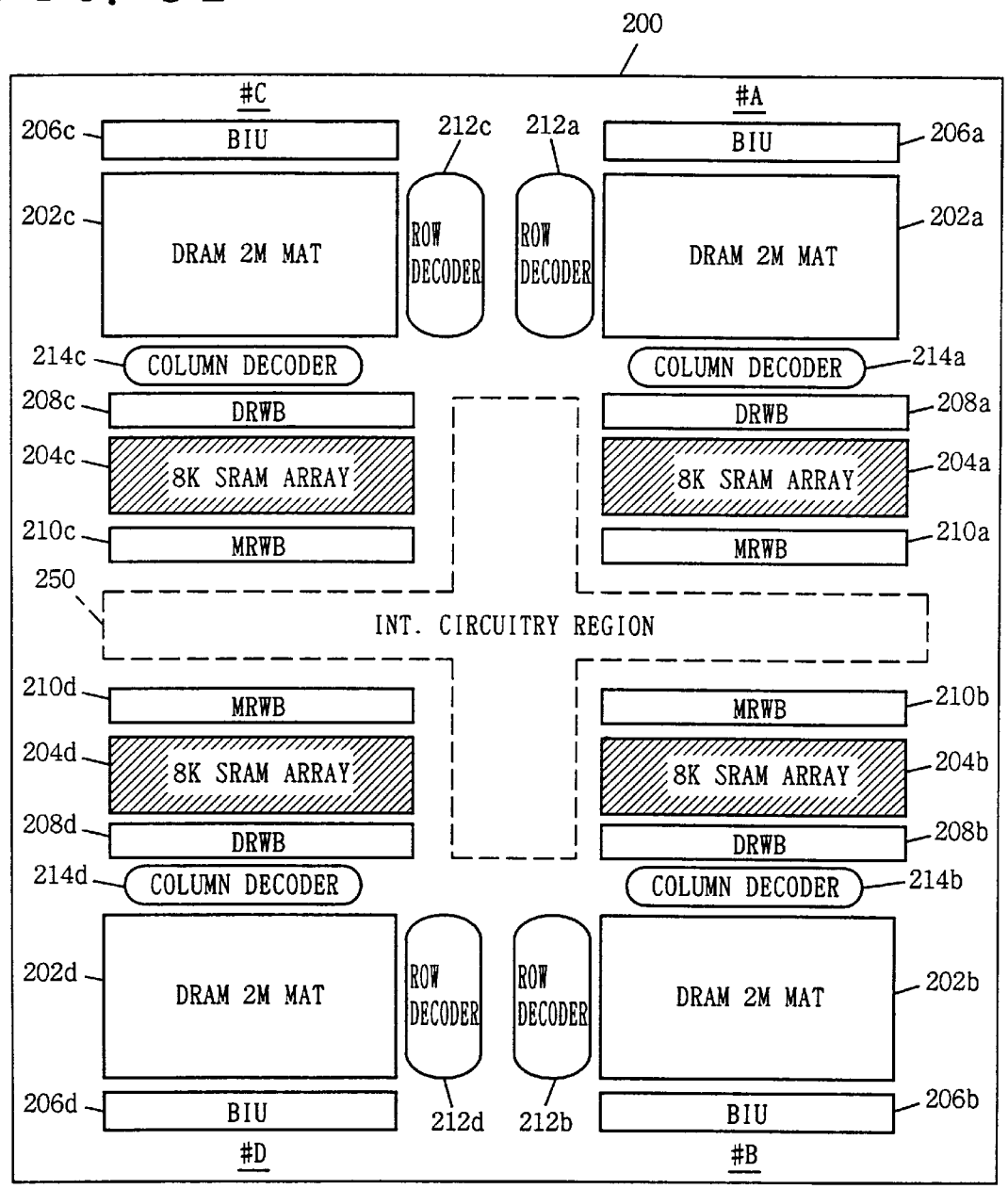
FIG. 32 schematically shows a chip layout of a memory integrated circuit device according to the present invention.

FIG. 32 schematically shows the layout of the entire chip of a memory integrated circuit device according to the present invention. In FIG. 32, a memory integrated circuit device 200 are divided into four regions #A, #B, #C and #D in arrangement. Arranged in region #A are a DRAM mat (array) 202a with a storage capacity of e.g. 2M bits and an SRAM array 204a with a storage capacity of e.g. 8K bits. Arranged on both sides of DRAM array 202a are a bus interface unit 206a as a first register and a DRAM read/write buffer register (DRWB) 208a as a second register. A column decoder 214a for selecting the columns of the DRAM memory cell array is arranged between DRAM memory array 202a and DRAM read/write buffer 208a. A row decoder 212a for selecting the rows of DRAM memory array 202a is arranged on that side closer to the center of the chip of DRAM memory array 202a. A memory read/write buffer (MRWB) 210a for transferring data to and from SRAM array 204a is arranged opposite to DRAM read/write buffer (DRWB) 208a with respect to SRAM array 204a. Memory read/write buffer 210a corresponds to register 100 shown in FIG. 31.

Arranged in region #B are a DRAM memory array (mat) 202b, an SRAM array 204b, a bus interface unit (BIU) 206b, a DRAM read/write buffer (DRWB) 208b, a memory read/write buffer (MRWB) 210b, a column decoder 214b and a row decoder 212b. Each component in region #A and each component in region #B are arranged in mirror symmetry with respect to the central region of the integrated circuit device. Bus interface units (BIUs) 206a and 206b each transfer data to and from the external and have function of changing a bus width depending on the external data bus. Thus, bus interface units (BIUs) 206a and 206b each include both the first register and the external interface.

Arranged in region #C are a DRAM array 202c, an SRAM array 204c, a bus interface unit (BIU) 206c, a DRAM read/write buffer GRWB) 208c, a memory read/write buffer MRWB) 210c, a row decoder 212c and a column decoder 214c. The components in region #C and those in region #A are arranged in mirror symmetry with respect to the centerline in the longitudinal direction of the figure.

Arranged in regions #D are a DRAM array 202d, an SRAM array 204d, a bus interface unit (BIU) 206d, a DRAM read/write buffer (DRWB) 208d, a memory read/write buffer (MRWB) 210d, a column decoder 214d and a row decoder 212d. The components in region #C and those in region #D are arranged in mirror symmetry with respect to the centerline extending in the lateral direction of integrated circuit device 200. Since the components in regions #A to #D are arranged in mirror symmetry along the centerlines, optimization of arrangement of the components in one region can readily result in the optimal arrangement of memory integrated circuit device 200.

Within the block region surrounded by the broken line shown in the center region of memory integrated circuit device 200, is provided an internal circuitry region 250 in which the internal circuits required are arranged. An internal circuit, a controller and the like are arranged in internal circuitry region 250.

SRAM arrays 204a, 204b, 204c and 204d are also provided with a row decoder, although not clearly shown in FIG. 32. The respective column decoders are arranged between the SRAM arrays and the respective memory read/write buffers (MRWBs). When data transfer between a memory read buffer (MRWB) and an SRAM array is performed for all of the bit lines simultaneously, the column select operation is not particularly required. SRAM arrays 204a to 204b each include memory cells arranged in 256 rows and 32 columns. DRAM arrays 202a to 202d each have 32 global IO lines. Accordingly, simultaneous data transfer in regions #A to #D allows 128-bit data transfer for the DRAM and SRAM arrays and thus rapid data transfer. Furthermore, when an internal circuit formed in internal circuitry region 250 accesses an SRAM array or a memory read/write buffer (MRWB), the internal circuit can rapidly process the data required.

According to the fifth embodiment of the present invention, out of the registers on the both sides of a DRAM, one register provided for an internal circuit is further connected to an SRAM via an internal data bus, as described above, and the internal circuit can access the SRAM as a high-speed memory and thus rapid data processing is achieved.

Other Applications

The internal circuit of the memory integrated circuit device according to the present invention can be any circuit with the function of producing address signals and control signals and can be a logic performing a logic operation under the control of a sequence controller and a processor performing an operation in accordance with a program.

The internal circuit may repetitively and sequentially performs a same processing, as in image data processing, without generating addresses. In this example, the internal circuit simply generates data request and addresses are internally and automatically generated at predetermined timings. An external controller controls data processing timing (which allows the state of progress to be monitored by means of an external clock signal), and also controls access to the DRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory integrated circuit device comprising:

a memory cell array having a plurality of memory cells arranged in rows and columns;

a plurality of internal data bus lines provided over said memory cell array, for data communication with a column selected in said memory cell array;

a plurality of registers each including a plurality of unit register circuits provided for said plurality of internal data bus lines respectively; and control circuitry responsive to an instruction of data transfer for selectively coupling a selected register of said plurality of registers with said plurality of internal data bus lines, said plurality of registers including registers arranged opposed to each other with respect to the internal data bus lines.

2. The memory integrated circuit device according to claim 1, wherein:

said memory cell array includes a plurality of subarray blocks arranged in rows and columns each of the subarray blocks having memory cells arranged in a plurality of rows and a plurality of columns, subarray blocks aligned in a row direction configuring a row block, subarray blocks aligned in a column direction configuring a column block, and a plurality of local data bus lines corresponding to the subarray blocks and provided a predetermined number for each of the subarray blocks; and said plurality of internal data bus lines include a plurality of global data bus lines formed in an interconnection layer different from a layer for said plurality of local data bus lines and provided a predetermined number for each of the column blocks.

3. The memory integrated circuit device according to claim 2, wherein:

said memory cell array has a shape of a quadrilateral; and said registers arranged opposed to each other are arranged along two sides of said quadrilateral and said two sides are opposite in said column direction.

4. The memory integrated circuit device according to claim 3, wherein:

said plurality of registers further include a register arranged along a side different from said two sides; and said memory integrated circuit device further comprises interconnection lines formed in an interconnection layer different from the layer for the global data bus lines, for connecting said register arranged along the different side and said global data bus lines together.

5. The memory integrated circuit device according to claim 4, wherein said interconnection lines are formed parallel to said local data bus lines and in an interconnection layer different from the layer for the local data bus lines.

6. The memory integrated circuit device according to claim 4, wherein said interconnection lines are formed parallel to said local data bus lines and in the same level interconnection layer as said local data bus lines.

7. The memory integrated circuit device according to claim 1, wherein at least one but not all of said plurality of registers is coupled with an external device to said memory integrated circuit device; and at least one other register of said plurality of registers is coupled with an internal circuit of said memory integrated circuit device.

8. The memory integrated circuit device according to claim 7, wherein said control circuitry includes:

a first control circuit responsive to an external control signal for controlling an operation of the register coupled with said external device; and a second control circuit responsive to a control signal from said internal circuit for controlling an operation of the register coupled with said internal circuit.

9. The memory integrated circuit device according to claim 1, wherein said control circuitry includes means responsive to an instruction of data read transfer for reading data of a memory cell selected from said memory cell array onto said internal data bus line and coupling the selected register selected from said plurality of registers with said internal data bus line.

10. The memory integrated circuit device according to claim 9, wherein said selected register includes means for reading in and holding the memory cell data read on said internal data bus line.

11. The memory integrated circuit device according to claim 1, wherein said control circuitry includes means responsive to an instruction of data write transfer, for coupling columns selected from said columns of said memory cell array with the internal data bus lines, coupling at least two registers among said plurality of registers with the internal data bus lines, transferring write data to said internal data bus lines from one register of said at least two registers designated according to said instruction of data write transfer, and writing the write data to said selected columns and to a remaining register of said at least two registers.

12. The memory integrated circuit device according to claim 1, wherein said memory cells of said memory cell array are dynamic type memory cells.

13. The memory integrated circuit device according to claim 1, wherein:

said memory cell array has a shape of a quadrilateral and the internal data bus lines are arranged along a direction in which said columns extend; and the registers arranged opposed to each other are arranged along two sides opposite in said direction in which said columns extend.

14. The memory integrated circuit device according to claim 13, wherein said plurality of registers further include a register arranged along a side different from the two sides opposite in the column direction of said quadrilateral and coupled with the internal data bus lines by an interconnection lines formed in an interconnection layer different from a layer for said internal data bus lines.

15. The memory integrated circuit device according to claim 14, wherein said interconnection lines are arranged over said memory cell array in a direction in which said rows extend.

16. The memory integrated circuit device according to claim 1, wherein said memory cell array and registers arranged opposite in the column direction of said memory cell array are arranged in each of four divided regions on a rectangular semiconductor chip.

17. A memory integrated circuit device comprising:
a memory cell array having a plurality of memory cells arranged in rows and columns;
a plurality of internal data bus lines provided over said memory cell array, for data communication with a column selected in said memory cell array;
a plurality of registers each including a plurality of unit register circuits provided for said plurality of internal data bus lines respectively; and
control circuitry responsive to an instruction of data transfer for selectively coupling a selected register of said plurality of registers with said plurality of internal data bus lines, wherein
at least one but not all of said plurality of registers is coupled with an external device to said memory integrated circuit device; and
at least one other register of said plurality of registers is coupled with an internal circuit of said memory integrated circuit device, and
wherein said internal circuit includes:
a memory unit accessible at a higher speed than said memory cell array; and
an internal bus line provided separately from said internal data bus line between said at least one other register and said memory unit.

18. The memory integrated circuit device according to claim 17, wherein said memory unit includes a plurality of static type memory cells.

19. A memory integrated circuit device comprising:
a memory cell array having a plurality of memory cells arranged in rows and columns;
a plurality of internal data bus lines provided over said memory cell array, for data communication with a column selected in said memory cell array;
a plurality of registers each including a plurality of unit register circuits provided for said plurality of internal data bus lines respectively; and
control circuitry responsive to an instruction of data transfer for selectively coupling a selected register of said plurality of registers with said plurality of internal data bus lines,
wherein said control circuitry includes means for transferring data between registers selected from said plurality of registers via said internal data bus line according to an instruction of data transfer between registers, said data transfer according to said instruction of data transfer between registers being carried out when a selected column of said memory cell array is disconnected from said internal data bus line.

20. A memory integrated circuit device comprising:
a memory cell array having a plurality of memory cells arranged in rows and columns;
a plurality of internal data bus lines provided over said memory cell array, for data communication with a column selected in said memory cell array;
a plurality of registers each including a plurality of unit register circuits provided for said plurality of internal data bus lines respectively; and
control circuitry responsive to an instruction of data transfer for selectively coupling a selected register of said plurality of registers with said plurality of internal data bus lines, wherein
at least one but not all of said plurality of registers is coupled with an external device to said memory integrated circuit device, and
at least one other register of said plurality of registers is coupled with an internal circuit of said memory integrated circuit device; and
wherein said control circuitry includes:
a decision circuit receiving an externally supplied instruction of a data reading request, an external address signal, and an instruction of a data reading request and an internal address signal supplied from the internal circuit, for deciding whether the externally supplied instruction of the data reading request and said instruction of the data reading request from said internal circuit are both activated and whether said external address signal and said internal address signal match; and
a read arbitration activating circuit responsive to a simultaneous activation indication and an indication of match indicative of the match of the addresses from said decision circuit, for coupling the register coupled with the external device and the register coupled with said internal circuit with said internal data bus line to read the data read on said internal data bus line into the register coupled with said external device and the register coupled with said internal circuit.

* * * * *